(12) United States Patent
Heo et al.

(10) Patent No.: US 12,342,705 B2
(45) Date of Patent: Jun. 24, 2025

(54) LIGHT EMITTING DISPLAY DEVICE INCLUDING A FIRST SPACER STRUCTURE SURROUNDING A SUBPIXEL IN A LOOP PATTERN

(71) Applicant: LG Display Co., Ltd., Seoul (KR)

(72) Inventors: Seung Ho Heo, Paju-si (KR); Chung Hoon Lee, Paju-si (KR); Dong Hyun Lee, Incheon (KR); Dong Min Jang, Incheon (KR)

(73) Assignee: LG Display Co., Ltd., Seoul (KR)

( * ) Notice: Subject to any disclaimer, the term of this patent is extended or adjusted under 35 U.S.C. 154(b) by 299 days.

(21) Appl. No.: 17/345,864

(22) Filed: Jun. 11, 2021

(65) Prior Publication Data
US 2021/0408163 A1 Dec. 30, 2021

(30) Foreign Application Priority Data
Jun. 26, 2020 (KR) .......................... 10-2020-0078445

(51) Int. Cl.
*H10K 59/35* (2023.01)
*H10K 50/15* (2023.01)
(Continued)

(52) U.S. Cl.
CPC .......... *H10K 59/353* (2023.02); *H10K 50/15* (2023.02); *H10K 50/16* (2023.02); *H10K 50/171* (2023.02);
(Continued)

(58) Field of Classification Search
CPC .................................................. H10K 59/353
See application file for complete search history.

(56) References Cited

U.S. PATENT DOCUMENTS

| 8,350,468 B2 | 1/2013 | Ko et al. |
| 9,871,085 B2 | 1/2018 | Cho et al. |

(Continued)

FOREIGN PATENT DOCUMENTS

| CN | 106783927 A | 5/2017 |
| CN | 106935630 A | 7/2017 |

(Continued)

OTHER PUBLICATIONS

China National Intellectual Property Administration, Office Action, Chinese Patent Application No. 202110692440.8, Dec. 25, 2024, 20 pages.

(Continued)

*Primary Examiner* — Peter Bradford
(74) *Attorney, Agent, or Firm* — Fenwick & West LLP

(57) ABSTRACT

Disclosed is a light emitting display device which may prevent or at least reduce lateral leakage current. The light emitting display device includes a substrate comprising a plurality of first to third subpixels arranged to neighbor one another, each of the first to third subpixels comprising an emission part and a non-emission part to surround the emission part; a bank at the non-emission parts; first electrodes covered with the bank and respectively at the first to third subpixels to expose the respective emission parts; a first spacer structure having an inversed tapered shape configured to surround at least one side of each of the emission parts of the first to third subpixels on the bank; a common layer structure located on the first electrodes and the first spacer structure and disconnected at an edge of the first spacer structure; and a second electrode on the common layer structure.

22 Claims, 23 Drawing Sheets

(51) Int. Cl.
  *H10K 50/16* (2023.01)
  *H10K 50/17* (2023.01)
  *H10K 59/122* (2023.01)
  *H10K 59/80* (2023.01)
  *H01L 27/32* (2006.01)
  *H01L 51/50* (2006.01)

(52) U.S. Cl.
  CPC ....... *H10K 59/122* (2023.02); *H10K 59/8723* (2023.02); *H10K 59/80522* (2023.02)

(56) References Cited

U.S. PATENT DOCUMENTS

| | | |
|---|---|---|
| 9,899,458 B2 | 2/2018 | Park |
| 10,516,004 B2 | 12/2019 | Park et al. |
| 11,417,860 B2 | 8/2022 | Lee et al. |
| RE49,260 E | 10/2022 | Park et al. |
| 12,178,071 B2 | 12/2024 | Lee et al. |
| 2010/0033084 A1 | 2/2010 | Ko et al. |
| 2012/0223342 A1* | 9/2012 | Tanada ................... H10K 59/86 257/40 |
| 2013/0001620 A1 | 1/2013 | Sugisawa et al. |
| 2016/0284774 A1* | 9/2016 | Zhang .............. H10K 59/80521 |
| 2016/0300894 A1* | 10/2016 | Park ..................... H10K 59/122 |
| 2016/0358985 A1* | 12/2016 | Bai ........................ H10K 59/00 |
| 2017/0155075 A1* | 6/2017 | Bi ........................ H10K 59/122 |
| 2017/0194399 A1* | 7/2017 | Cho .................... H10K 59/131 |
| 2017/0250232 A1* | 8/2017 | Wang .................. H10K 50/856 |
| 2018/0013092 A1* | 1/2018 | Park ..................... H10K 59/8723 |
| 2018/0190731 A1 | 7/2018 | Park et al. |
| 2019/0173042 A1* | 6/2019 | Lim ..................... H10K 59/353 |
| 2020/0144540 A1 | 5/2020 | Lee et al. |
| 2021/0208715 A1* | 7/2021 | Yang ..................... H10K 50/82 |
| 2022/0013602 A1* | 1/2022 | Chen .................... H10K 71/166 |
| 2022/0085125 A1* | 3/2022 | Yun ...................... H10K 59/351 |
| 2022/0344620 A1 | 10/2022 | Lee et al. |

FOREIGN PATENT DOCUMENTS

| | | |
|---|---|---|
| CN | 108281462 A | 7/2018 |
| CN | 111146246 A | 5/2020 |
| KR | 10-2010-0003243 A | 1/2010 |
| KR | 10-2016-0120869 A | 10/2016 |
| KR | 10-2017-0080249 A | 7/2017 |
| KR | 10-2019-0116962 A | 10/2019 |

OTHER PUBLICATIONS

Korean Intellectual Property Office, Office Action, Korean Patent Application No. 10-2020-0078445, Mar. 25, 2025, 14 pages.

* cited by examiner

LIGHT EMITTING DISPLAY DEVICE INCLUDING A FIRST SPACER STRUCTURE SURROUNDING A SUBPIXEL IN A LOOP PATTERN

CROSS-REFERENCE TO RELATED APPLICATION

This application claims the benefit of Republic of Korea Patent Application No. 10-2020-0078445, filed on Jun. 26, 2020, which is hereby incorporated by reference in its entirety.

FIELD OF TECHNOLOGY

The present disclosure relates to a light emitting display device, and more particularly, to a light emitting display device which may reduce lateral leakage current between adjacent subpixels using a structure provided on a bank.

DISCUSSION OF THE RELATED ART

Recently, display devices have been developed into various types so as to satisfy requirements, such as flexibilization, miniaturization, maximization, etc.

Among display devices, a light emitting display device, which includes light emitting devices respectively provided in a plurality of pixels or subpixels provided on a substrate, and thus omits an external light source so as to realize slimness, is considered as a competitive application.

The light emitting display device includes a plurality of layers in each of the light emitting devices, and in this case, has common layers which are formed in common in the respective pixels or subpixels in order to avoid use of a fine metal mask.

Due to the common layers provided in common in the pixels or subpixels, current may flow to adjacent pixels or subpixels through the common layers extending two-dimensionally. Such current is referred to as lateral leakage current.

SUMMARY

Accordingly, the present disclosure is directed to a light emitting display device which may reduce lateral leakage current using a structure provided on a bank.

An object of the present disclosure is to provide a light emitting display device which may define a structure for separating common layers into regions corresponding to subpixels using a structure provided on a bank without a separate mask, and may thus disclosure lateral leakage current between adjacent subpixels.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the disclosure, as embodied and broadly described herein, a light emitting display device including a substrate including a plurality of first to third subpixels arranged to neighbor one another, each of the first to third subpixels including an emission part and a non-emission part configured to surround the emission part, a bank provided in the non-emission parts, first electrodes covered with the bank and respectively provided in the first to third subpixels so as to expose the respective emission parts, a first spacer structure having an inverse tapered shape configured to surround at least one side of each of the emission parts of the first to third subpixels on the bank, a common layer structure located on the first electrodes and the first spacer structure and disconnected at an edge of the first spacer structure, and a second electrode located on the common layer structure.

In another aspect of the present disclosure, a light emitting display device includes a substrate including a plurality of emission parts and non-emission parts between the emission parts, first electrodes respectively provided in the emission parts, a bank configured to selectively overlap the first electrodes and provided in the non-emission parts, a first spacer structure having an inverse tapered shape configured to have open regions formed in a virtual closed loop configured to surround at least one of the emission parts and to surround at least one side of each of the emission parts, between adjacent emission parts on the bank, a common layer structure located on the first electrodes and the first spacer structure and disconnected at an edge of the first spacer structure, and a second electrode located on the common layer structure.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION

Figure 1:
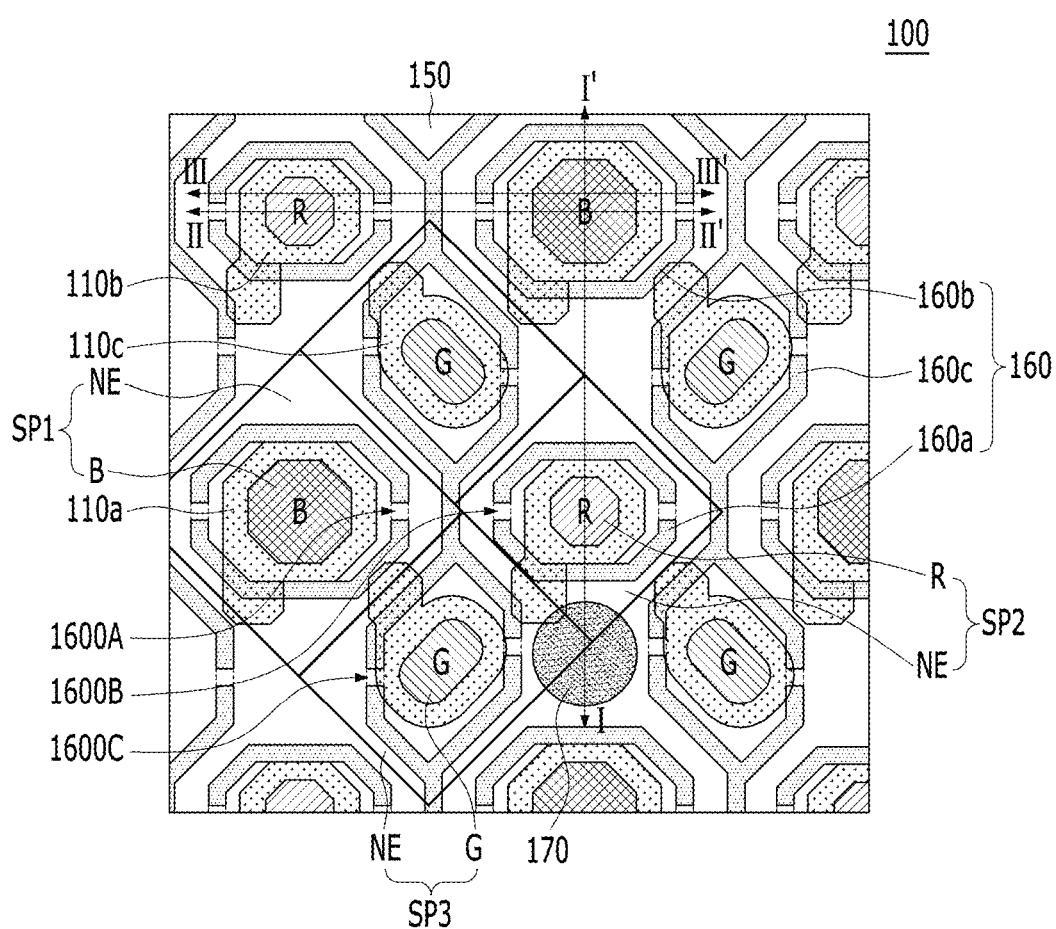
FIG. 1 is a plan view illustrating a light emitting display device according to a first embodiment of the present disclosure.

Reference will now be made in detail to the exemplary embodiments of the present invention, examples of which are illustrated in the accompanying drawings. In the following description of the embodiments and the drawings, the same or similar elements are denoted by the same reference numerals throughout the specification. In the following description of the embodiments of the present invention, a detailed description of known functions and configurations incorporated herein will be omitted when it may make the subject matter of the present invention rather unclear. Further, the names of elements used in the following description of the embodiments of the present invention are selected in consideration of ease of preparation of the specification, and may thus differ from the names of parts of an actual product.

The shapes, sizes, ratios, angles and numbers of elements given in the drawings to describe the embodiments of the present invention are merely exemplary, and thus, the present invention is not limited to the illustrated details. In the following description of the embodiments, the terms "including", "comprising" and "having" are to be interpreted as indicating the presence of one or more other characteristics, numbers, steps, operations, elements or parts stated in the specification or combinations thereof, and do not exclude the presence of other characteristics, numbers, steps, operations, elements, parts or combinations thereof, or the possibility of adding the same, unless the term "only" is used. It will be understood that a singular expression of an element(s) encompasses a plural expression unless stated otherwise.

In interpretation of elements included in the various embodiments of the present invention, it is to be interpreted that the elements include error ranges unless stated otherwise.

In the following description of the embodiments, it will be understood that, when positional relationships are expressed, for example, when an element is said to be "on", "above", "under" or "beside" another element, the two elements may directly contact each other, or one or more other elements may be interposed between the two elements, unless the term "just" or "directly" is used.

In the following description of the embodiments, it will be understood that, when the terms "first", "second", etc. are used to describe various elements, these terms are used merely to distinguish the same or similar elements. Therefore, a first element described hereinafter could be termed a second element without departing from the technical scope of the invention.

Respective features of the various embodiments of the present invention may be partially or wholly coupled to or combined with each other and be interlocked or driven in various technical manners, and the respective embodiments may be implemented independently of each other or be implemented together through connection therebetween.

Figure 2:
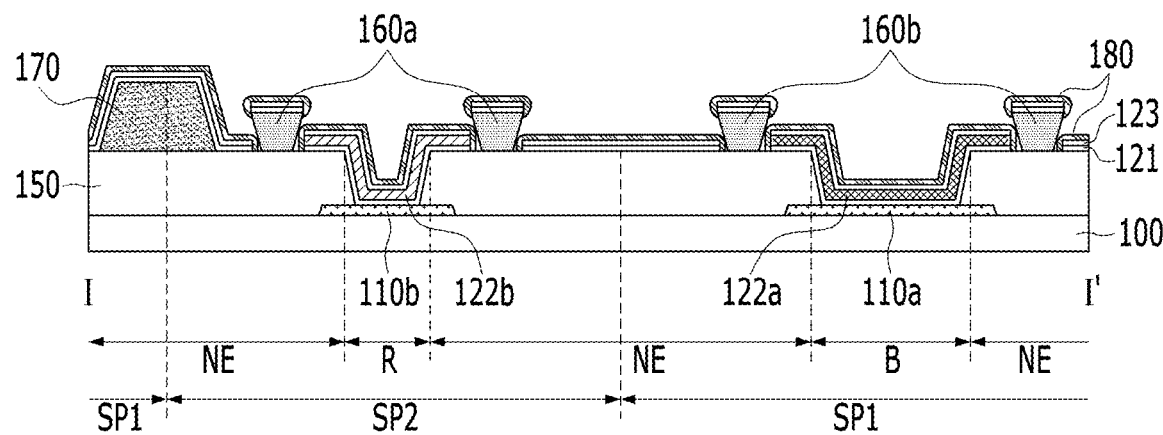
FIG. 2 is a cross-sectional view taken along line I-I' of FIG. 1 according to the first embodiment of the present disclosure.
Figure 3:
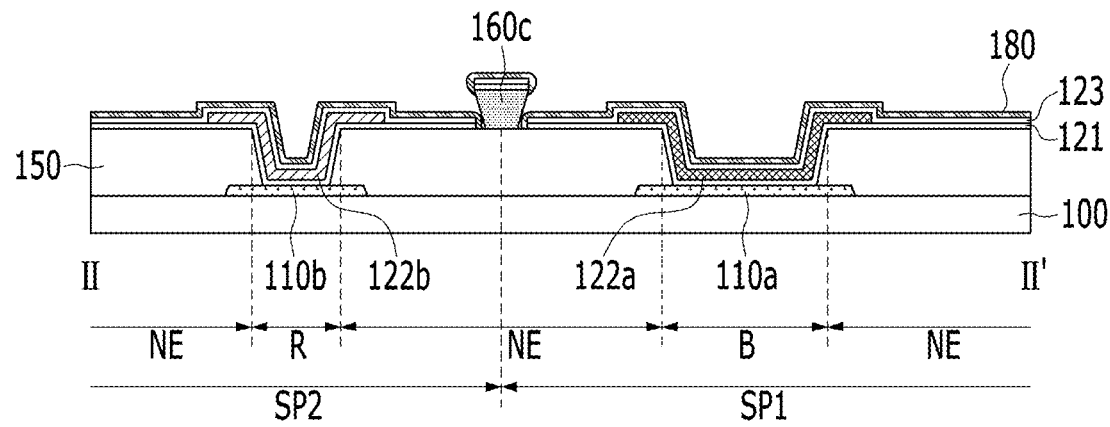
FIG. 3 is a cross-sectional view taken along line II-II' of FIG. 1 according to the first embodiment of the present disclosure.
Figure 4:
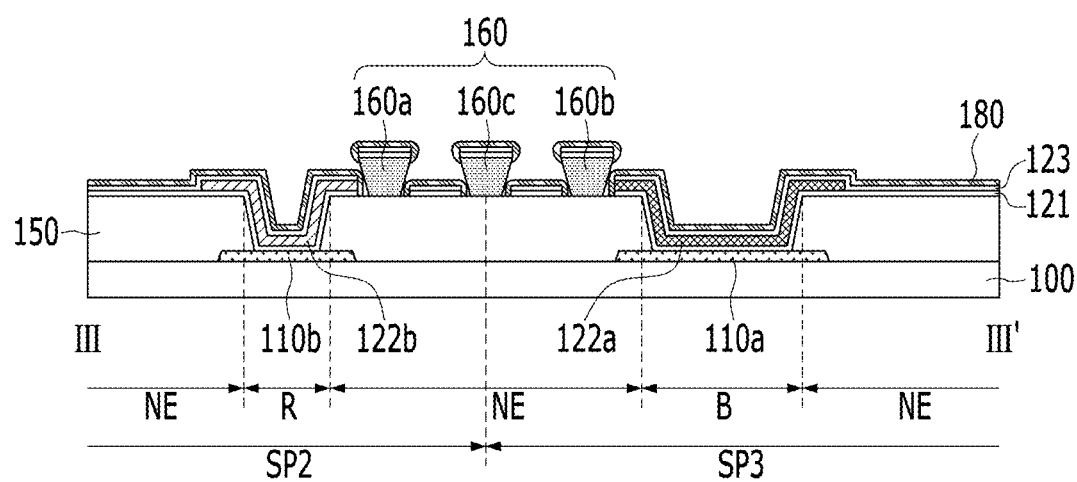
FIG. 4 is a cross-sectional view taken along line of FIG. 1 according to the first embodiment of the present disclosure.

FIG. 1 is a plan view illustrating a light emitting display device according to a first embodiment of the present disclosure. FIG. 2 is a cross-sectional view taken along line I-I' of FIG. 1, FIG. 3 is a cross-sectional view taken along line II-II' of FIG. 1, and FIG. 4 is a cross-sectional view taken along line III-III' of FIG. 1 according to the first embodiment of the present disclosure.

As shown in FIGS. 1 to 4, the light emitting display device according to the first embodiment of the present disclosure includes a substrate 100 including a plurality of first to third subpixels SP1, SP2 and SP3 arranged to neighbor one another, each of the first to third subpixels SP1, SP2 and SP3 including an emission part B, R or G, and a non-emission part NE configured to surround the emission part B, R or G, a bank 150 provided in the non-emission parts NE, first electrodes 110a, 110b and 110c covered with the bank 150 and respectively provided in the first to third subpixels SP1, SP2 and SP3 so as to expose the respective emission parts B, R and G, and a first spacer structure 160a, 160b and 160c having an inverse tapered shape configured to surround at least one side of a corresponding one of the emission parts B, R and G of the first to third subpixels SP1, SP2 and SP3 on the bank 150.

Further, in the light emitting display device according to the present disclosure, light emitting devices, each of which includes the first electrode 110a, 110b or 110c, a second electrode 180 provided opposite the first electrode 110a, 110b or 110c, and an organic stack 121, 122a 122b and 123 filling a space between the first electrode 110a, 110b or 110c and the second electrode 180, are provided in the respective subpixels SP1, SP2 and SP3. The light emitting device including a light emitting layer 122a or 122b formed of an organic light emitting material may be referred to as an organic light emitting device, the light emitting device including the light emitting layer 122a or 122b formed of a quantum dot material may be referred to as a quantum dot light emitting device, and the light emitting device including the light emitting layer 122a or 122b formed of a mixture of organic and inorganic materials may be referred to as a hybrid light emitting device. However, the light emitting devices of the light emitting display device according to the present disclosure are not limited in materials thereof. The light emitting display device according to the present disclosure includes one or more common layers 121 and 123 of a common layer structure which may be formed without a fine metal mask, and may be applied to self-light emitting devices having various structures as long as the common layers 121 and 123 may be separated into regions by the first spacer structure 160: 160a, 160b and 160c so as to prevent or reduce lateral leakage current between adjacent subpixels.

The first and second common layers 121 and 123 may be formed along the upper surface of the first spacer structure 160: 160a, 160b and 160c, and the upper surfaces of the first electrodes 110a, 110b and 110c and the upper and side surfaces of the bank 150, which are exposed outside the first spacer structure 160: 160a, 160b and 160c.

Further, the second electrode 180 may be formed on the second common layer 123. The second electrode 180 including a metal material has relatively good step coverage, and may thus be formed not only on the upper part of the second common layer 123 but also on the side part of the second common layer 123.

FIG. 1 illustrates one arrangement of the subpixels SP1, SP2 and SP3 of the light emitting display device according to the first embodiment of the present disclosure, and in this case, the first subpixels SP1 and the second subpixels SP2 may be alternately arranged in rows and columns, and the third subpixels SP3 may be arranged to alternate with each of the first subpixels SP1 and the second subpixels SP2 in a diagonal direction. In more detail, referring to FIG. 1, the first subpixels SP1 and the third subpixels SP3 are alternately arranged on a first diagonal line from upper left to lower right, and the second subpixels SP2 and the third subpixels SP3 are alternately arranged on a second diagonal line parallel to the first diagonal line. A set of one first subpixel SP1, one second subpixel SP2 and two third subpixels SP3 in a diamond region forms one pixel.

The first spacer structure 160 corresponding to at least one of the first to third subpixels SP1, SP2 and SP3 may have open regions 1600A, 1600B or 1600C formed in a virtual closed loop configured to surround the emission part of the at least of the first to third subpixels SP1, SP2 and SP3. Although FIG. 1 illustrates the first spacer structure 160 corresponding to all of the first to third subpixels SP1, SP2 and SP3 as having the open regions 1600A, 1600B or 1600C adjacent to the corresponding emission parts B, R and G, the disclosure is not limited thereto, and the first spacer structure 160 corresponding to one of the first to third subpixels SP1, SP2 and SP3 may have open regions, or the first spacer structure 160 corresponding to two of the first to third subpixels SP1, SP2 and SP3 may have open regions.

The present disclosure is characterized in that the first spacer structure 160: 160a, 160b and 160c having the inverse tapered shape is located on the bank 150 between adjacent subpixels SP1, SP2 and SP3 so that at least one of the common layers 121 and 123 deposited after formation of the first spacer structure 160: 160a, 160b and 160c may be disconnected at the side walls of the first spacer structure 160: 160a, 160b and 160c having the inverse tapered shape. Thereby, even though the common layer has high conductivity, leakage current flowing to adjacent subpixels through the common layer may be prevented or at least reduced. Particularly, due to provision of the first spacer structure 160: 160a, 160b and 160c, a separate deposition mask configured to separate the common layers 121 and 123 into regions corresponding to the subpixels SP1, SP2 and SP3 may not be used in formation of the common layers 121 and 123. Because the width of the upper side of the first spacer structure 160 is greater than the width of the lower side of the first spacer structure 160, as seen in the cross-section thereof, organic matter forming the common layers 121 and 123 is not accumulated on a region of the bank 150 under the upper side of the first spacer structure 160, and thus, the common layers 121 and 123 may be structurally separated into a region corresponding to the first spacer structure 160 and a region corresponding to the surroundings thereof as the boundary. That is, even though a space corresponding to a difference between the length of the upper side and the length of the lower side of the first spacer structure 160 is exposed from the bank 150, the common layers 121 and 123 are not formed in this space because the upper side of the first spacer structure 160 functions as a screen. The common layer structure including common layers 121 and 123 is formed by supplying vaporized organic materials to the upper surface of the substrate 100 from a supply source provided above the substrate 100. Because the vaporized organic materials having straightness are deposited, the common layers 121 and 123 are effectively formed on the upper surface of the first spacer structure 160 or on the upper surfaces of the first electrodes 110a or 110b or the upper surface of the bank 150 located outside the first spacer structure 160, but are difficult to uniformly and continuously form on the regions of the bank 150 covered by the upper surface of the first spacer structure 160, and thus the common layers 121 and 123 are structurally separated by the first spacer structure 160.

As shown in FIG. 1, in the light emitting display device according to the first embodiment of the present disclosure, the first spacer structure 160 include first patterns 160b configured to surround the emission parts B of the first subpixels SP1, second patterns 160a configured to surround the emission parts R of the second subpixels SP2, and third patterns 160c configured to surround the emission parts G of the third subpixels SP3. The first to third patterns 160b, 160a and 160c may have the open regions 1600A, 1600B and 1600C in the virtual closed loop shapes configured to surround the emission parts B, R and G of the first to third subpixels SP1, SP2 and SP3.

The first pattern 160b provided around the emission part B of the first subpixel SP1 exhibits the following effects. In order to drive the first subpixel SP1, the first subpixel SP1 is turned on by applying a voltage equal to or higher than the threshold voltage Vth of the first subpixel SP1 thereto, and in this case, as shown in FIGS. 2 to 4, the common layers 121 and 123 are disconnected at the edge of the first pattern 160b, and thus, little or no current leaks horizontally from the first subpixel SP1 towards adjacent subpixels and the second and third subpixels SP2 and SP3 having low threshold voltages are not turned on by leakage current. The second pattern 160a structurally separates the first and second common layers 121 and 123, and may thus prevent the second subpixel SP2 having the lower threshold voltage than the first and third subpixels SP1 and SP3 from being influenced by turning-on of adjacent first and third subpixels SP1 and SP3. The third pattern 160c structurally separates the first and second common layers 121 and 123, and may thus prevent the third subpixel SP3 having the lower threshold voltage than the first subpixel SP1 from being influenced by turning-on of an adjacent first subpixel SP1.

The threshold voltages of the first to third subpixels SP1, SP2 and SP3 are the minimum voltages required to drive thin film transistors (not shown) connected to the respective first electrodes 110a, 110b and 110c. Although FIGS. 2 to 4 do not illustrate the thin film transistors, the thin film transistors, each of which includes a semiconductor layer, a gate electrode, a source electrode and a drain electrode, may be provided between the substrate 100 and the first electrodes 110a, 110b and 110c.

The open regions 1600A, 1600B and 1600C are provided in the first to third patterns 160b, 160a and 160c so as to prevent or at least reduce an increase in linear resistance in a specific direction of the second electrode 180. The second electrode 180 is provided in common in the subpixels SP1, SP2 and SP3, and is formed without using a mask or is formed using an open mask configured to cover only the non-active area outside the subpixels SP1, SP2 and SP3. The second electrode 180 is formed on the second common layer 123, includes a metal so as to have good step coverage compared to the organic matter forming the common layers 121 and 123, and may thus be formed not only on the upper part of the second common layer 123 but also on the side parts of the first and second common layers 121 and 123. However, as the angle of the side part of the first spacer structure 160 from the surface of the bank 150 is decreased, a region, in which the second electrode 180 is not formed on the side part of the first spacer structure 160, may occur. The light emitting display device according to the present invention may prevent an increase in resistance in a specific line direction of the second electrode 180 through the open regions 1600A and 1600B in the horizontal direction and the open region 1600C in the vertical direction, even though the second electrode 180 is not formed on a portion of the side part of the first spacer structure 160.

The width of the first spacer structure 160 is less than the critical dimension CD of the emission part having the smallest size among the emission parts B, R and G of the subpixels SP1, SP2 and SP3. Further, the width of the first spacer structure 160 is narrow so that, even though a plurality of patterns are arranged between adjacent emission parts B, R and G, the patterns may be spaced apart from one another, and the length of the first spacer structure 160 may be greater than the length of at least one side of each of the emission parts B, R and G. The respective patterns 160b, 160a and 160c forming the first spacer structure 160 is separated from one another so as to be distinguished from one another, and are provided around the emission parts B, R and G such that the length thereof is greater than the width thereof so as to prevent or reduce lateral leakage current from adjacent subpixels SP1, SP2 and SP3. In the first embodiment, the third pattern 160c has extensions between adjacent open areas 1600A and 1600B of the first and second patterns 160b and 160a, thereby being capable of effectively preventing or at least reducing leakage current from the first subpixel SP1 to the second subpixel SP2 among the first and second subpixels SP1 and SP2 having the maximum threshold voltage difference. The extension is located between the emission parts G of adjacent third subpixels SP3 in the vertical direction, and may thus connect the third patterns 160c surrounding the respective emission parts G. In this case, when the first subpixel SP1 emits light, the path of current flowing in the first subpixel SP1 towards the adjacent second subpixel SP2 in the same row is blocked, the path of the current flowing in the first subpixel SP1 directly towards the adjacent second subpixel SP2 in the same column is also blocked by the first pattern 160b and the second pattern 160a, and thus, the current flowing in the first subpixel SP1 makes a detour through the adjacent second subpixel SP2 along the side part of the third pattern 160c, the path of the current is elongated, and thereby, turning-on of the second subpixels SP2 due to lateral leakage current may be prevented.

Here, the open regions 1600c of the third pattern 160c surrounding the emission part G of one third subpixel SP3 may be located on different horizontal lines.

Further, in the light emitting display device according to the present disclosure, the first spacer structure 160 having the inverse tapered shape provided on the bank 150 are limited in terms of the length and width thereof so as to prevent or at least reduce an increase in sheet resistance of a specific region of the second electrode 180 formed after formation of the common layers 121 and 123. Therefore, the second electrode 180 may maintain uniform voltage throughout the respective regions thereof. That is, the first spacer structure 160 has the open regions 1600A, 1600B and 1600C for some of the emission parts B, R and G, thereby being capable of preventing or at least reducing an increase in the resistance of the second electrode 180 in a specific direction.

In the arrangement shown in FIG. 1, the first subpixels SP1 have the largest size, the second subpixels SP2 have the smallest size, the emission parts B and R of the first and second subpixels SP1 and SP2 have an octagonal shape, the emission parts G of the third subpixels SP3 have a rectangular shape which extends in a diagonal direction and has rounded corners. Further, FIG. 1 illustrates that the third subpixels SP3 are arranged at a density two times that of the first and second subpixels SP1 and SP2. This arrangement is only one example, and the light emitting display device according to the present disclosure proposes a method for more effectively solving lateral leakage current in an arrangement structure in which subpixels are provided in a non-stripe type. The following embodiments will propose different arrangement structures. As will be described below, even in these different arrangement structures of subpixels, a first spacer structure 160 having an inverse tapered shape may also be arranged adjacent to emission parts so as to prevent or reduce lateral leakage current between the emission parts of adjacent subpixels.

The "inverse tapered shape" in the description of the present disclosure is a shape in which the length of the upper side of the first spacer structure 160: 160a, 160b and 160c is greater than the length of the lower side of the first spacer structure 160: 160a, 160b and 160c, as seen in the cross-section thereof, and thus, the side part of the first spacer structure 160 forms an acute angle from the surface of the bank 150 provided outside the first spacer structure 160. In contrast, a second spacer structure 170 having a positive tapered shape, which is the opposite of the inverse tapered shape is provided, as shown in FIG. 2, and the "positive tapered shape" is a shape in which the length of the upper side of the second spacer structure 170 is smaller than the length of the lower side of the second spacer structure 170, as seen in the cross-section thereof, and thus, the side part of the second spacer structure 170 forms an obtuse angle from the surface of the bank 150 provided outside the second spacer structure 170.

The second spacer structure 170 is formed in a shape having a greater width and a greater height than the first spacer structure 160: 160a, 160b and 160c. The second spacer structure 170 primarily comes into contact with a deposition mask (not shown), used when the organic matter is deposited on the substrate 100 using the deposition mask, so as to support the deposition mask, thus protecting lower elements, for example, the bank 150 and the first spacer structure 160: 160a, 160b and 160c. The second spacer structure 170 may be formed on the bank 150 so as to be spaced apart from the first spacer structure 160: 160a, 160b and 160c. Because the second spacer structure 170 must uniformly support the deposition mask throughout the entirety of the substrate 100, the second spacer structure 170 may be arranged in each of the subpixels SP1, SP2 and SP3 so as to have a designated width (area).

The above-described bank 150, a first spacer structure 160 and second spacer structure 170 may be formed of organic insulating materials, such as photoacryl, polyimide and/or polyamide, and the bank 150, the first spacer structure 160 and the second spacer structure 170 may include the same organic insulating material or at least one thereof may include a different organic insulating material. Further, in order to form different heights and different tapered shapes, the bank 150, the first spacer structure 160 and the second spacer structure 170 may be formed through different processes, or the bank 150 and the second spacer structure 170 may be primarily formed of the same organic material using a half-tone mask and subsequently the first spacer structure 160 may be formed of a different organic material in regions spaced apart from the second spacer structure 170.

In the light emitting display device according to the first embodiment of the present disclosure, in order to control lateral leakage current, the first spacer structure 160: 160a, 160b and 160c is not limited to a uniaxial shape in plan view, but have a shape surrounding the emission parts B, R and G and include the open regions 1600A, 1600B and 1600C in the virtual closed loops configured to surround the emission parts B, R and G. Further, as shown in FIG. 1, the first subpixels SP1 and the second subpixels SP2 are alternately arranged in one row so that the open regions 1600A and 1600B of the first patterns 160b and the second patterns 160a are located on the same horizontal line, and the extensions of the third patterns 160c pass between the first patterns 160b and the second patterns 160a, thereby being capable of preventing or reducing leakage current on the horizontal line passing through the open regions 1600A and 1600B between the first and second subpixels SP1 and SP2 due to presence of the third patterns 160c between the open regions 1600A and 1600B.

In some cases, the open regions 1600A of the first patterns 160b and the open regions 1600B of the second patterns 160a may be located on different horizontal lines so as to elongate the path of leakage current flowing on the horizontal lines.

The first electrodes 110a, 110b and 110c may have protrusions protruding outwards from the respective emission parts B, R and G, and the protrusions may be connected to the corresponding thin film transistors (not shown).

The common layers 121 and 123 of the common structure are formed in common without distinction of the subpixels SP1, SP2 and SP3. That is, these common layers 121 and 123 may be formed on the substrate 100 without using any mask, or may be formed on the substrate 100 using a common mask which covers the non-active area outside the subpixels SP1, SP2 and SP3 while opening all of the subpixels SP1, SP2 and SP3 on the substrate 100. Therefore, use of fine metal masks, which have openings finely adjusted so as to correspond to emission parts of respective subpixels or specific subpixels, is reduced and thus an equipment burden may be remarkably reduced, and it is not necessary to align respective common layers with each other and thus yield may be remarkably improved.

The common layer structure including the common layers 121 and 123 may include, for example, an organic stack used to form the light emitting devices. The organic stack may include at least one of a hole injection layer, a hole transport layer, an electron blocking layer, an emission layer, a hole blocking layer, an electron transport layer, an electron injection layer and a charge generation layer. The light emitting device includes the first electrodes 110a, 110b or 110c, the second electrode 180, and the organic stack located therebetween.

The example shown in FIGS. 2 to 4 shows the first electrodes 110a and 110b, the second electrode 180, and the first common layer 121, emission layers 122a and 122b and the second common layer 123, which are sequentially deposited on the substrate 100 in the upward direction, in the first and second subpixels SP1 and SP2. Although not shown in these figures, the third subpixels SP3 may have the same layer structure as the first and second subpixels SP1 and SP2.

Although the illustrated example shows that the first common layer 121 is provided under the emission layers 122a and 122b as a single layer and the second common layer 123 is provided on the emission layers 122a and 122b as a single layer, the disclosure is not limited thereto, and the first common layer 121 may include different layers, such as a hole injection layer, a hole transport layer and an electron blocking layer, and the second common layer 123 may include different layers, such as a hole blocking layer and electron transport layer. Further, although the illustrated example shows that the emission layers 122a and 122b are provided as a single layer in the first and second subpixels SP1 and SP2, a plurality of stacks divided from each other by a charge generation layer may be provided between the first electrodes 110a, 110b and 110c and the second electrode 180. Here, each "stack" means a configuration which essentially includes a hole transport layer, an emission layer and an electron transport layer.

The example of FIGS. 2 and 4 shows that the first emission layer 122a configured to emit light with a first color is provided in each first subpixel SP1 and the second emission layer 122b configured to emit light with a second color different from the first color is provided in each second subpixel SP2, independently. The first and second emission layers 122a and 122b may be formed using a fine metal mask having openings corresponding to the emission parts B of the first subpixels SP1 and the emission parts R of the second subpixels SP2 so as to be selectively formed in the emission parts B of the first subpixels SP1 and the emission parts R of the second subpixels SP2. Although not shown in these figures, an emission layer configured to emit light with a color different from the colors of light emitted by the first and second emission layers 122a and 122b may be provided in each third subpixel SP3 in the same manner.

Although the example shown in FIGS. 2 to 4 represents the emission layers 122a and 122b as being independently provided in the respective subpixels so as to express colors of light emitted from the respective subpixels, the light emitting display device according to the present invention is not limited to thereto, and an emission layer may also be formed in common in a plurality of subpixels. In this case, in order to express various colors of light, a color filter layer or color conversion members may be further provided at the exit side of the light emitting display device separately from the emission layer.

The first subpixel SP1 may include the first electrode 110a, the second electrode 180, and the first emission layer 122a configured to contact the first common layer 121 and the second common layer 123 between the first electrode 110a and the second electrode 180 so as to emit light with a first color, the second subpixel SP2 may include the first electrode 110b, the second electrode 180, and the second emission layer 122b configured to contact the first common layer 121 and the second common layer 123 between the first electrode 110b and the second electrode 180 so as to emit light with a second color having a longer wavelength than the wavelength of the first color, and the third subpixel SP3 may include the first electrode 110c, the second electrode 180, and a third emission layer configured to contact the first common layer 121 and the second common layer 123 between the first electrode 110b and the second electrode 180 so as to emit light with a third color having a wavelength between the wavelength of the first color and the wavelength of the second color.

Although the illustrated example of the light emitting display device according to the present disclosure represents that the first color is blue, the second color is red and the third color green, the disclosure is not limited to this color combination, and other color combinations may be implemented. In addition to the first to third colors, subpixels configured to emit white light or light with other colors rather than the first to third colors may be further provided.

Organic luminescent materials for respective colors require different threshold voltages, and among the blue, green and red organic luminescent materials which are currently known, the threshold voltage of the blue organic luminescent materials is highest, and the threshold voltage of the red organic luminescent materials is lowest. Therefore, in a light emitting display device having no structure for preventing lateral leakage current, such as the first spacer structure 160, even when only blue subpixels are selectively turned on, other subpixels driven at threshold voltages lower than that of the blue subpixels may be turned on, and in this case, among red and green subpixels, the red subpixels driven at the lower threshold voltage may be more influenced by the turning-on of the blue subpixels. Depending on the threshold voltages of the colors of light emitted by the respective subpixels, in the light emitting display device according to the present invention, the first spacer structure 160 may be formed such that weight is assigned between the blue subpixel and the red subpixel, among the red and green subpixels adjacent to the blue subpixel.

FIG. 1 illustrates that, among the subpixels SP1, SP2 and SP3 shown in FIG. 1, the first subpixels SP1 have the largest size (e.g., area) and the second subpixels SP2 have the smallest size (e.g., area). The color of light emitted by the largest subpixels or the smallest subpixels may vary according to an application to which the light emitting display device is applied.

In the light emitting display device according to the present disclosure, the common layer structure including the first and second common layers 121 and 123 is structurally separated into regions on the first spacer structure 160 and regions on the surroundings thereof by the first spacer structure 160 without a fine metal mask, as described above, and, because the organic materials of the common layers 121 and 123 having high straightness are deposited, the first and second common layers 121 and 123 are not formed on the inverse tapered side surface of the first spacer structure 160, and are thus be separated into regions corresponding to the adjacent subpixels.

The second electrode 180 formed after formation of the second common layer 123 is formed of a transparent or transflective component or an opaque metal component. The second electrode 180 having metal component has good step coverage compared to the first and second common layers 121 and 123 formed of organic matter. The second electrode 180 may be formed on a portion of the side part of the first spacer structure 160, and may be formed to cover not only the upper parts of the first and second common layers 121 and 123 but also the side parts of the first and second common layers 121 and 123 formed on the bank 150.

In the light emitting display device according to the present disclosure, because the common layer structure including the first and second common layers 121 and 123 must be separated by the first spacer structure 160, the height of the first spacer structure 160 may be greater than the total thickness of the organic stack formed between the first electrodes 110a, 110b or 110c and the second electrode 180. The organic stack includes the emission layer, and when the thicknesses of the organic stacks of the respective subpixels SP1, SP2 and SP3 are different, the first spacer structure 160 is formed to have a greater height than the thickness of the thickest organic stack. In order to prevent or at least reduce lateral leakage current due to the first spacer structure 160, the width of the lower side of the first spacer structure 160 shown in FIGS. 2 to 4 may be 1 µm to 5 µm, and the height of the first spacer structure 160 may be equal to or greater than 1 µm which is less than the height of the second spacer structure 170. The width of the upper side of the second spacer structure 170 may be 3 times to 10 times the width of the lower side of the first spacer structure 160, and the height of the second spacer structure 170 may be equal to or less than 5 µm.

Although not shown in the drawings, a capping layer (not shown) may be further provided on the second electrode 180 in order to improve luminous efficacy, and an encapsulation layer formed by alternately at least one pair of an inorganic film and an organic film or an encapsulation substrate may be further provided on the capping layer in order to protect the light emitting devices from ambient air and to block moisture. When the encapsulation layer is applied, the encapsulation layer enters the side parts of the first and second spacer structure 160 and 170 on the bank 150, and at least the organic film of the encapsulation layer has a thickness equal to or greater than the sum of the thickness of the bank 150 and the height of the second spacer structure 170, and thus, the upper surface of the encapsulation layer planarizes the whole area of the light emitting display device including the subpixels.

Figure 5:
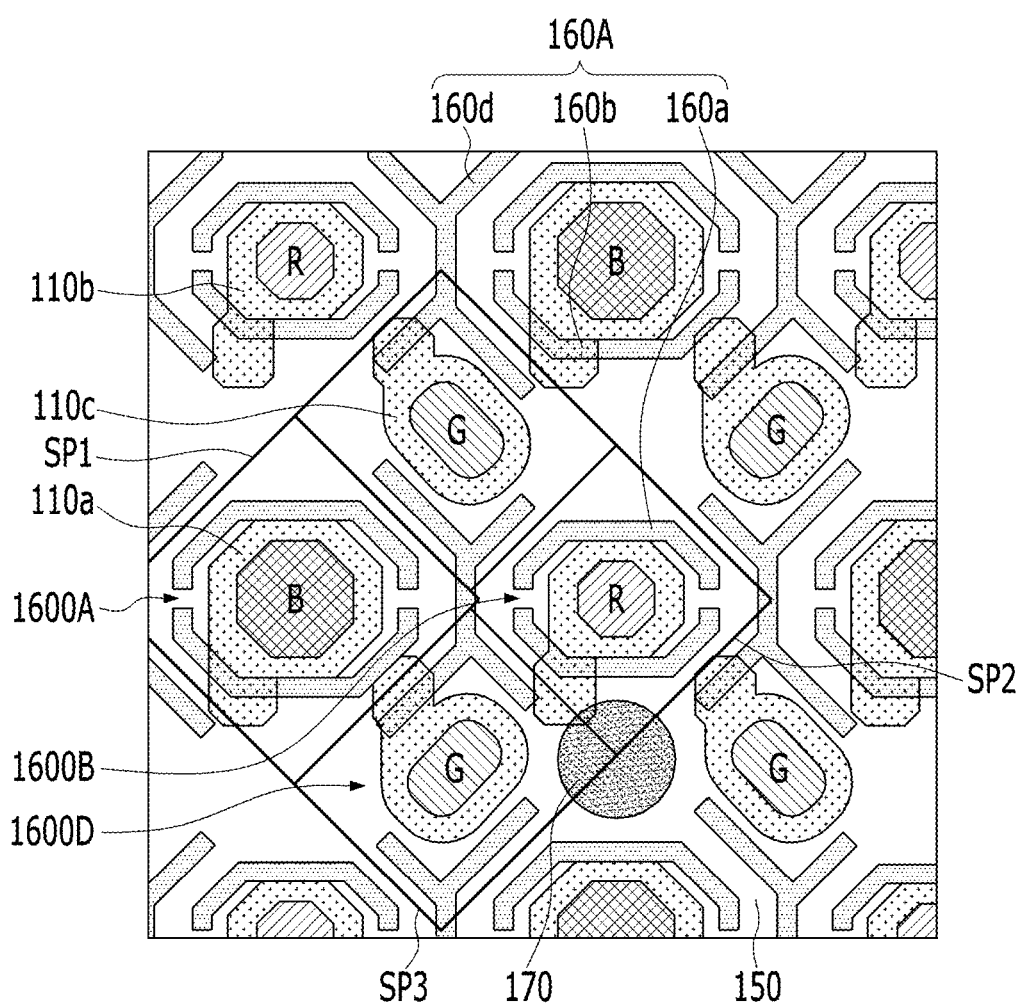
FIG. 5 is a plan view illustrating a light emitting display device according to a second embodiment of the present disclosure.

FIG. 5 is a plan view illustrating a light emitting display device according to a second embodiment of the present disclosure.

As shown in FIG. 5, in the light emitting display device according to the second embodiment of the present disclosure, third patterns 160d of a first spacer structure 160A are arranged at a low density, and thus, third open regions 1600D of the third patterns 160d are relatively expanded, compared to the first embodiment. In this case, the density of the first spacer structure 160A in horizontal rows, in which the third subpixels SP3 are arranged so as to neighbor one another, with respect to a second electrode 180 is decreased, compared to the first embodiment, and thus resistance of the second electrode 180 may be reduced, and first and third patterns 160b, 160a and 160d are arranged so as to correspond to emission parts B, R and G and thus the effect in which, when a specific subpixel is turned on, the flow of current from the corresponding subpixel to the emission parts of adjacent subpixels is blocked may be exhibited, in the same manner as the first embodiment.

Figure 6:
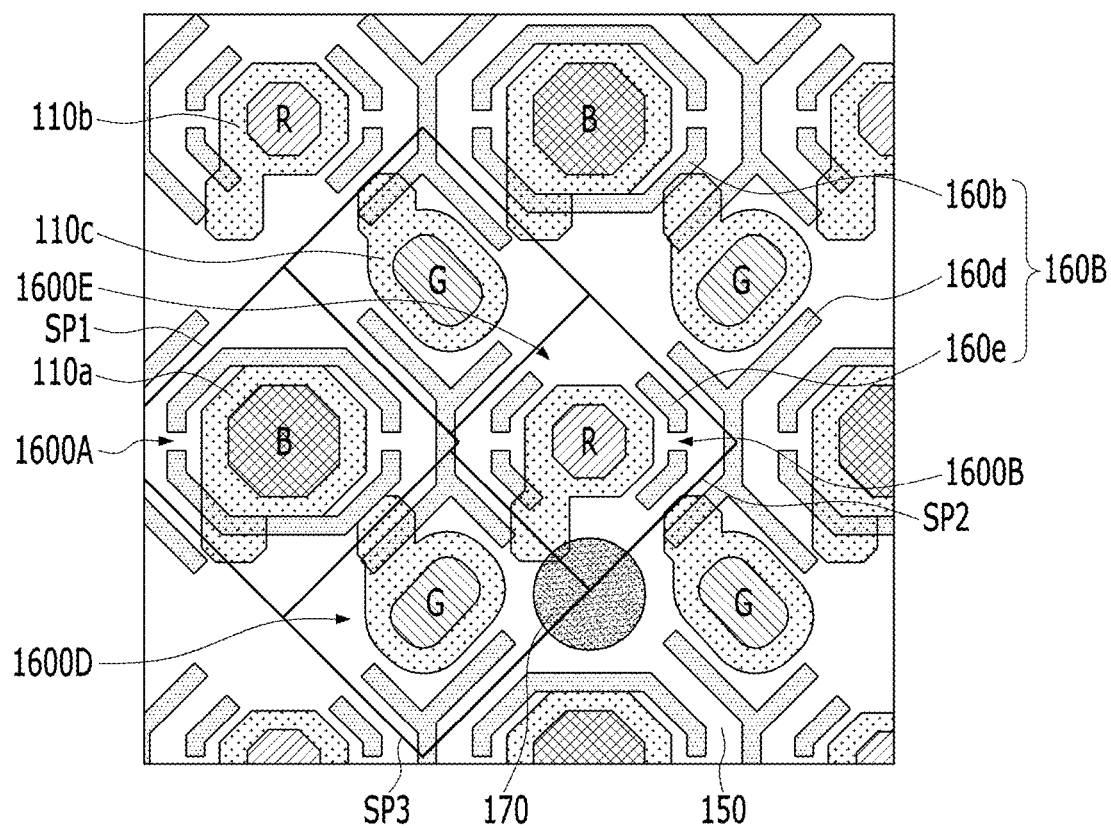
FIG. 6 is a plan view illustrating a light emitting display device according to a third embodiment of the present disclosure.

FIG. 6 is a plan view illustrating a light emitting display device according to a third embodiment of the present disclosure.

As shown in FIG. 6, in the light emitting display device according to the third embodiment of the present disclosure, in a first spacer structure 160B, a second pattern 160e configured to surround the emission part R of a second subpixel SP2 is divided into four pieces and thus has second open regions 1600B, which are symmetrical to each other on a horizontal line, and first sub-open regions 1600E, which are symmetrical to each other on a vertical line. Third patterns 160d are arranged at a low density, in the same manner as those in the second embodiment, and thus resistance of a second electrode 180 in the horizontal direction may be reduced.

Further, the first sub-open regions 1600E have a relatively large size, and first patterns 160b are arranged opposite the first sub-open regions 1600E. Therefore, in a first subpixel SP1 and a second subpixel SP2 which are arranged vertically adjacent to each other, leakage current flowing from the first subpixel SP1 directly to the second subpixel SP2 in the vertical direction may be blocked by the first pattern 160b, and leakage current flowing from the emission part B of the first subpixel SP1 through a first open region 1600A may make a detour through a space between the first pattern 160b and the adjacent third pattern 160d. Therefore, leakage current in the vertical direction may be prevented or reduced.

The effect in which leakage current flowing in the horizontal direction is blocked by the third pattern 160d provided between the second open region 1600B and the first open region 1600A is the same as in the first embodiment.

That is, even in this case, the first to third patterns 160b, 160e and 160d are configured to surround the corresponding emission parts B, R and G, and thus, the effect in which, when a specific subpixel is turned on, the flow of current from the corresponding subpixel to the emission parts of adjacent subpixels is blocked may be exhibited, in the same manner as the first embodiment.

Further, in the light emitting display device according to the third embodiment of the present invention, as shown in FIG. 6, due to additional provision of the first sub-open regions 1600E, a space between the first and second subpixels SP1 and SP2 adjacent to each other in the vertical direction on the bank 150 is increased, and thus a margin of a region, in which a second spacer structure 170 will be arranged between the first and second subpixels SP1 and SP2 adjacent to each other in the vertical direction, may be secured.

Figure 7:
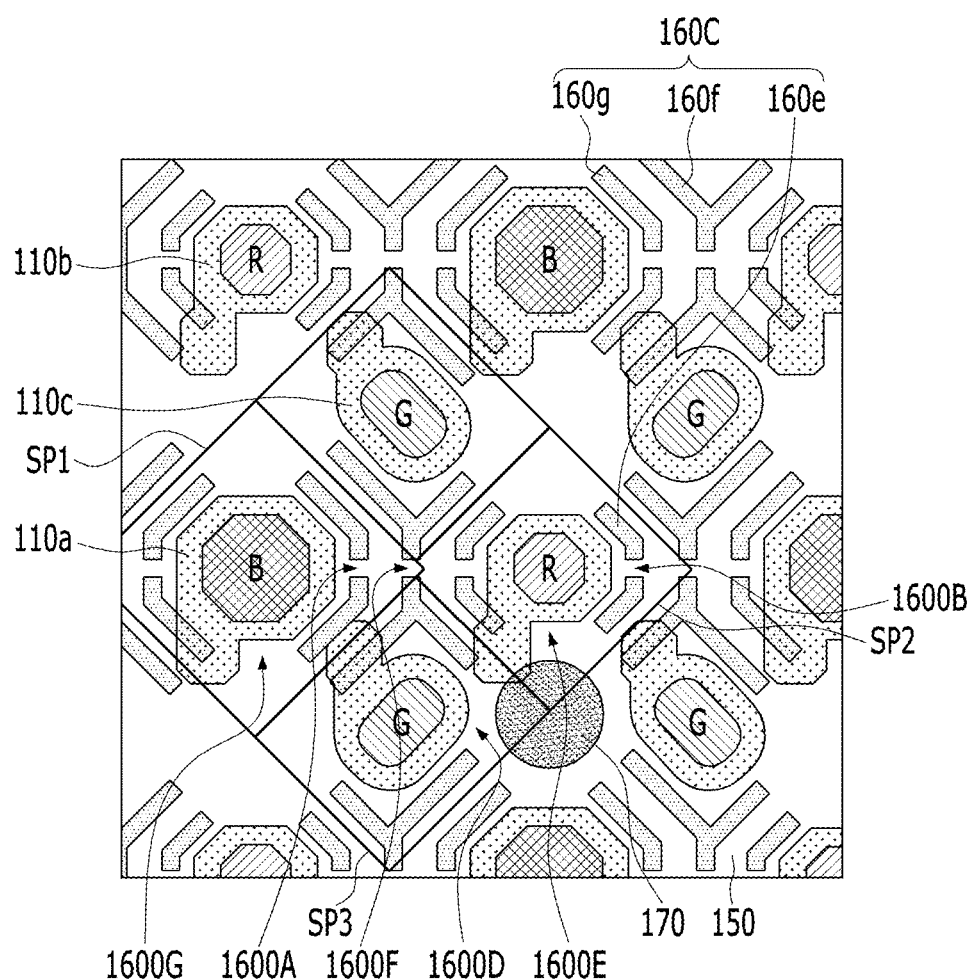
FIG. 7 is a plan view illustrating a light emitting display device according to a fourth embodiment of the present disclosure.

FIG. 7 is a plan view illustrating a light emitting display device according to a fourth embodiment of the present disclosure.

As shown in FIG. 7, in the light emitting display device according to the fourth embodiment of the present disclosure, in a first spacer structure 160C, a first pattern 160g configured to surround the emission part B of a first subpixel SP1 is divided into four pieces and thus has first open regions 1600A, which are symmetrical to each other in the horizontal direction, and second sub-open regions 1600G, which are symmetrical to each other in the vertical direction, in the same manner as second patterns 160e, and a fourth open region 1600F is further formed in the extensions of third patterns 160f configured to surround the emission parts G of adjacent third subpixels SP3, compared to the third embodiment.

Because a distance between the emission parts B and R of the first and second subpixels SP1 and SP2 adjacent to each other in the vertical direction is long, a flow path of leakage current is long and thus the influence of leakage current may be reduced. Because the first open region 1600A of the first pattern 160g, the fourth open region 1600F of the third pattern 160f, and the second open region 1600B of the second pattern 160e are continuously located between the first subpixel SP1 and the second subpixel SP2 adjacent to each other in the horizontal direction, some leakage current in the horizontal direction may occur, compared to the first to third embodiments, but the fourth open region 1600F is located at a position different from the positions of the first and second open regions 1600A and 1600B, thereby being capable of generating a bypass path of leakage current in the horizontal direction. Otherwise, a consecutive distance between the first open region 1600A, the fourth open region 1600F and the second open region 1600B, which are continuously located, in the length direction of a horizontal direction or a vertical direction or a diagonal direction may be reduced so as to reduce the width of the path of the leakage current in the length direction.

Further, the light emitting display device according to the fourth embodiment of the present invention, as shown in FIG. 7, may increase a margin for arranging a second spacer structure 170 and reduce the resistance of a second electrode 180, in the same manner as the third embodiment.

Figure 8:
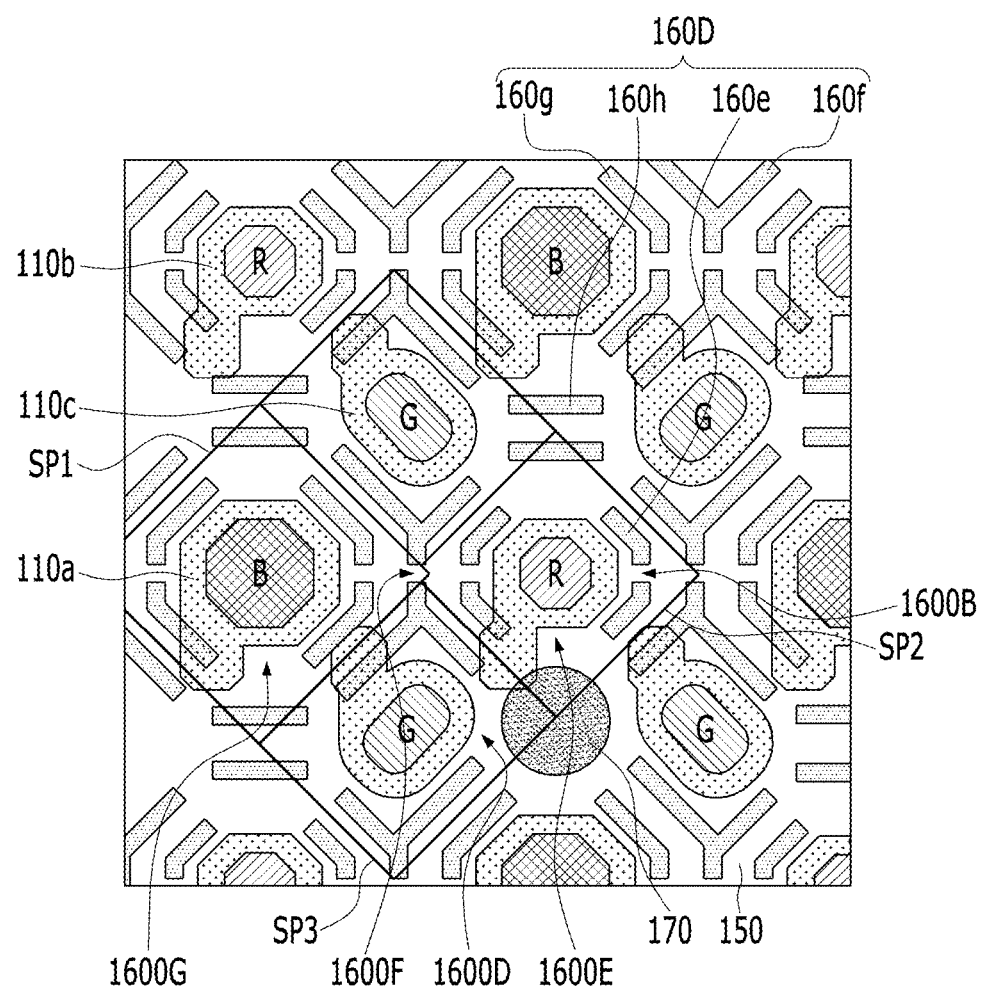
FIG. 8 is a plan view illustrating a light emitting display device according to a fifth embodiment of the present disclosure.

FIG. 8 is a plan view illustrating a light emitting display device according to a fifth embodiment of the present invention.

As shown in FIG. 8, in the light emitting display device according to the fifth embodiment of the present disclosure, a first spacer structure 160D further includes bar-shaped fourth patterns 160h between a first subpixel SP1 and a second subpixel SP2 adjacent to each other in the vertical direction, compared to the fourth embodiment. In this case, the fourth patterns 160h may be provided in an island-type, and although this figure illustrates two fourth patterns 160h provided between the first and second subpixels SP1 and SP2 adjacent to each other, one fourth pattern 160h may be provided or three or more fourth patterns 160h may be provided so as to increase the arrangement density.

The light emitting display device according to the fifth embodiment shown in FIG. 8 includes the fourth patterns 160h, thus being capable of more effectively blocking leakage current in the vertical direction, compared to the fourth embodiment.

Hereinafter, other modified embodiments will be described.

FIGS. 9A to 9E are plan views illustrating light emitting display devices according to sixth to tenth embodiments of the present invention.

Figure 9A:
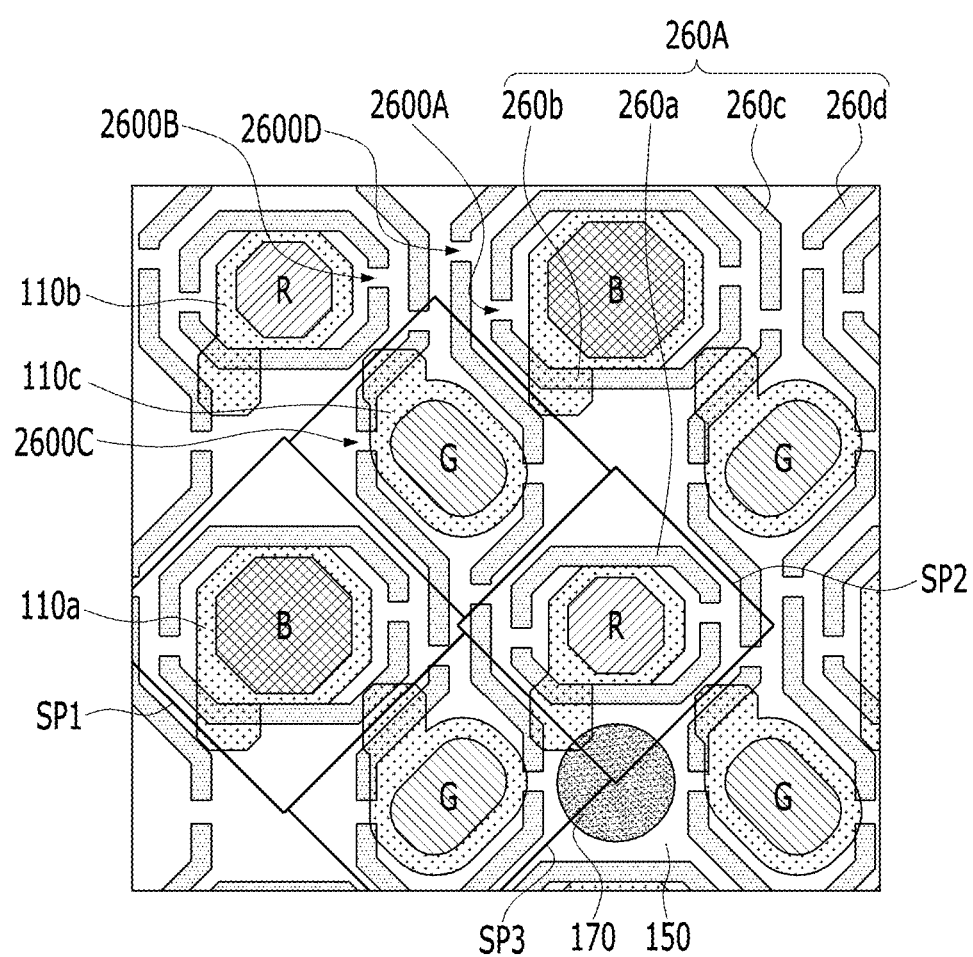
FIGS. 9A to 9E are plan views illustrating light emitting display devices according to sixth to tenth embodiments of the present disclosure, respectively.

As shown in FIG. 9A, in the light emitting display device according to the sixth embodiment of the present disclosure, a first spacer structure 260A includes first patterns 260b configured to surround emission parts B of first subpixels SP1, second patterns 260a configured to surround emission parts R of second subpixels SP2, and third patterns 260c and 260d configured to surround emission parts G of third subpixels SP3.

Here, the first patterns 260b and the second patterns 260a include first open regions 2600A and second open regions 2600B which are not located on the same horizontal line. Thereby, the effect of blocking leakage current in the horizontal direction may be increased.

Further, the third patterns 260c and 260d may be divided into first subpatterns 260c adjacent to the first patterns 260b and second subpatterns 260d adjacent to the second patterns 260a. The first subpatterns 260c and the second subpatterns 260d may have third open regions 2600C between the first and second subpatterns 260c and 260d adjacent to the emission parts G in the vertical direction. In this case, two third open regions 2600C located at the left and right sides of the emission part G may be provided on different horizontal lines. Further, the first and second subpatterns 260c and 260d have a shape which extends to be bent in the outward direction of the emission part G. Further, the first subpatterns 260c and the second subpatterns 260d may have fourth open regions 2600D outside the emission parts G, and in this case, two third open regions 2600D located at the left and right of the emission part G may also be provided on different horizontal lines.

The first open region 2600A, the fourth open regions 2600D and the second open region 2600B are located on different horizontal lines between the first and second subpixels SP1 and SP2 adjacent to each other in the horizontal direction, so as to form a zigzag-shaped path of leakage current, thereby being capable of increasing the length of the path of leakage current and thus reducing generation of lateral leakage current when a specific subpixel is turned on.

Figure 9B:
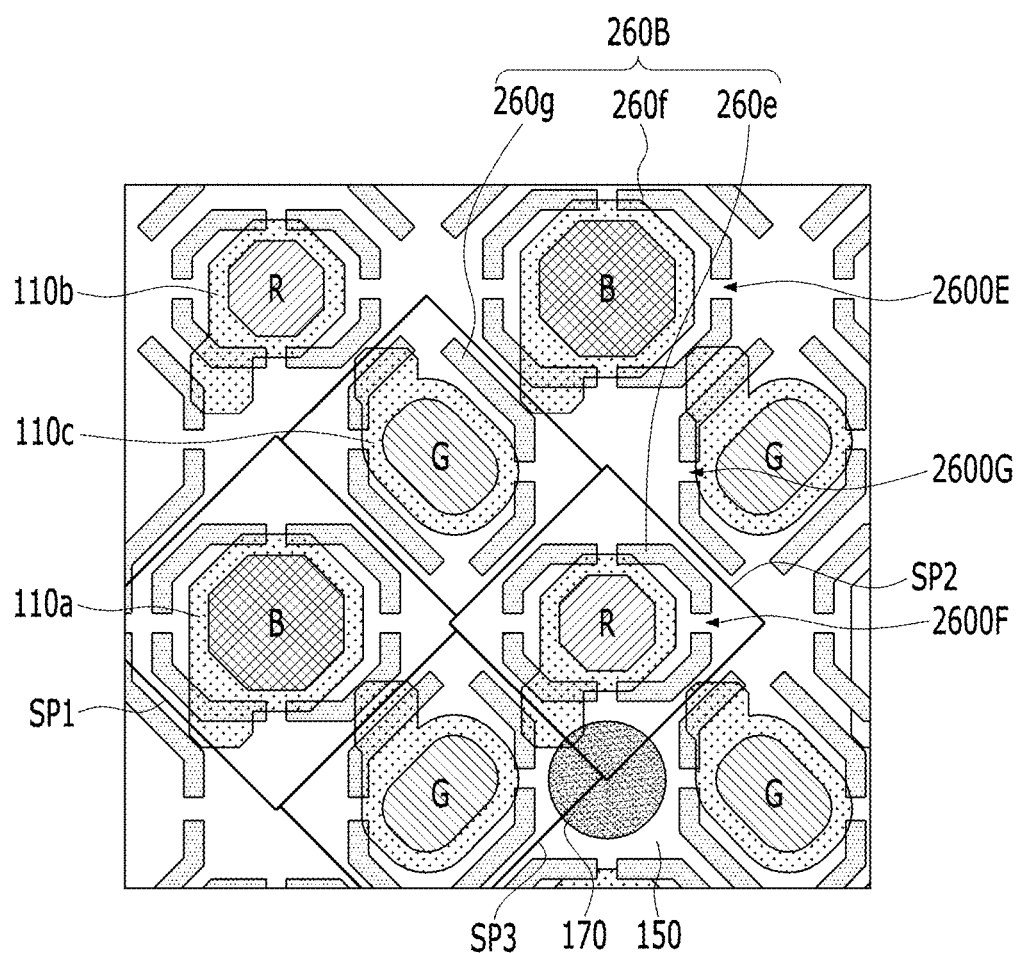

As shown in FIG. 9B, in the light emitting display device according to the seventh embodiment of the present disclosure, a first spacer structure 260B includes first to third patterns 260f, 260e and 260g configured to surround respective emission parts B, R and G of first to third subpixels SP1, SP2 and SP3, the first patterns 260*f* have fifth open regions 2600E, the second patterns 260*e* have sixth open regions 2600F, and the third patterns 260*g* have seventh open regions 2600G.

In this case, when a distance among the emission parts B, R and G of the subpixels SP1, SP2 and SP3 is sufficiently long, the effect of blocking leakage current may be exhibited.

Figure 9C:
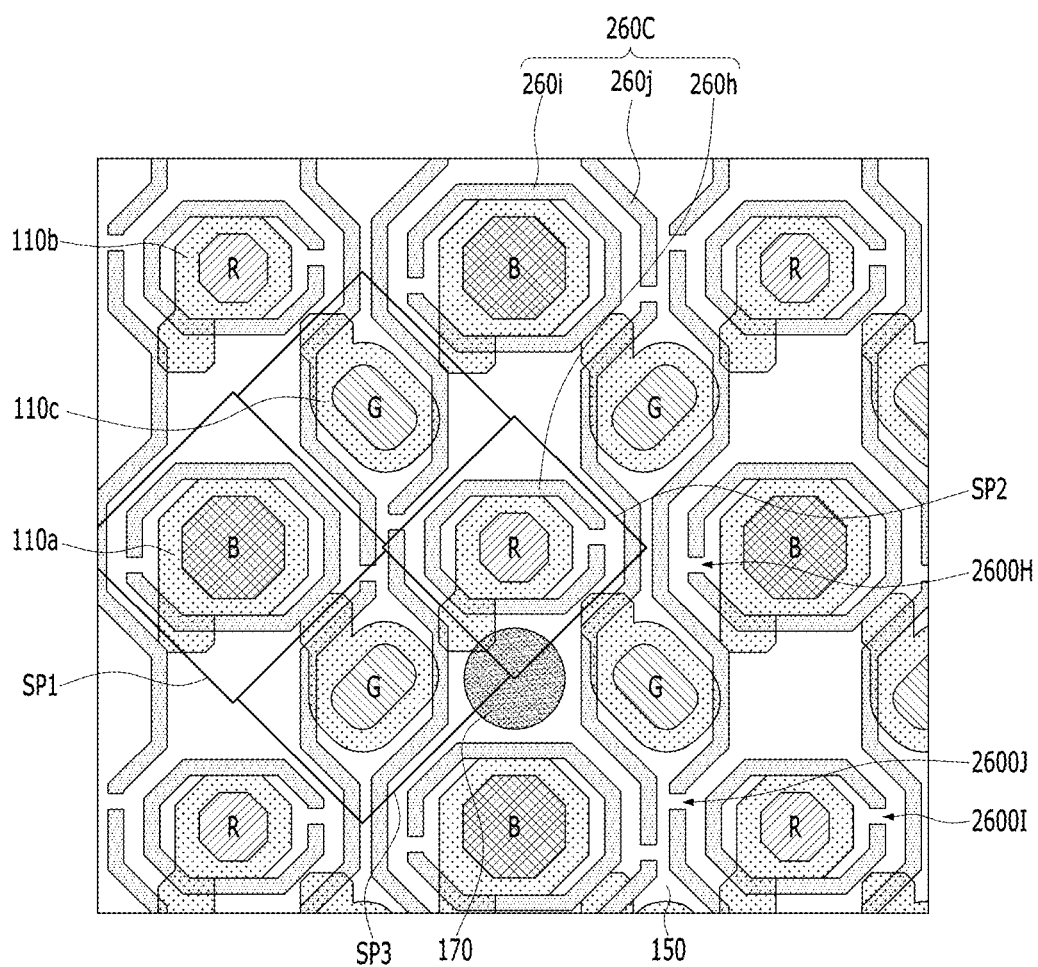

As shown in FIG. 9C, in the light emitting display device according to the eighth embodiment of the present disclosure, a first spacer structure 260C is configured such that an eighth open region 2600H is formed in only one side of a first pattern 260*i* surrounding the emission part B of each of first subpixels SP1, and a ninth open region 2600I is formed in only one side of a second pattern 260*h* surrounding the emission part R of each of second subpixels SP2. In this case, each of the first patterns 260*i* and the second patterns 260*h* is not divided, and is provided in an integral type. Further, third patterns 260*j* configured to surround the emission parts G of third subpixels SP3 extend so as to be bent upwards and downwards from the emission parts G in the outward direction, and thus passes between the first pattern 260*i* and the second pattern 260*h* adjacent to each other. The third patterns 260*j* are separately formed at both sides of the emission parts G, and may have tenth open regions 2600J which are formed in extensions thereof outside the emission parts G so as to be located on different horizontal lines parallel to each other.

In the light emitting display device according to the eighth embodiment, the open regions 2600H, 2600I and 2600J are not continuously provided in both the horizontal direction and the vertical direction, thereby being capable of effectively blocking leakage current.

Figure 9D:
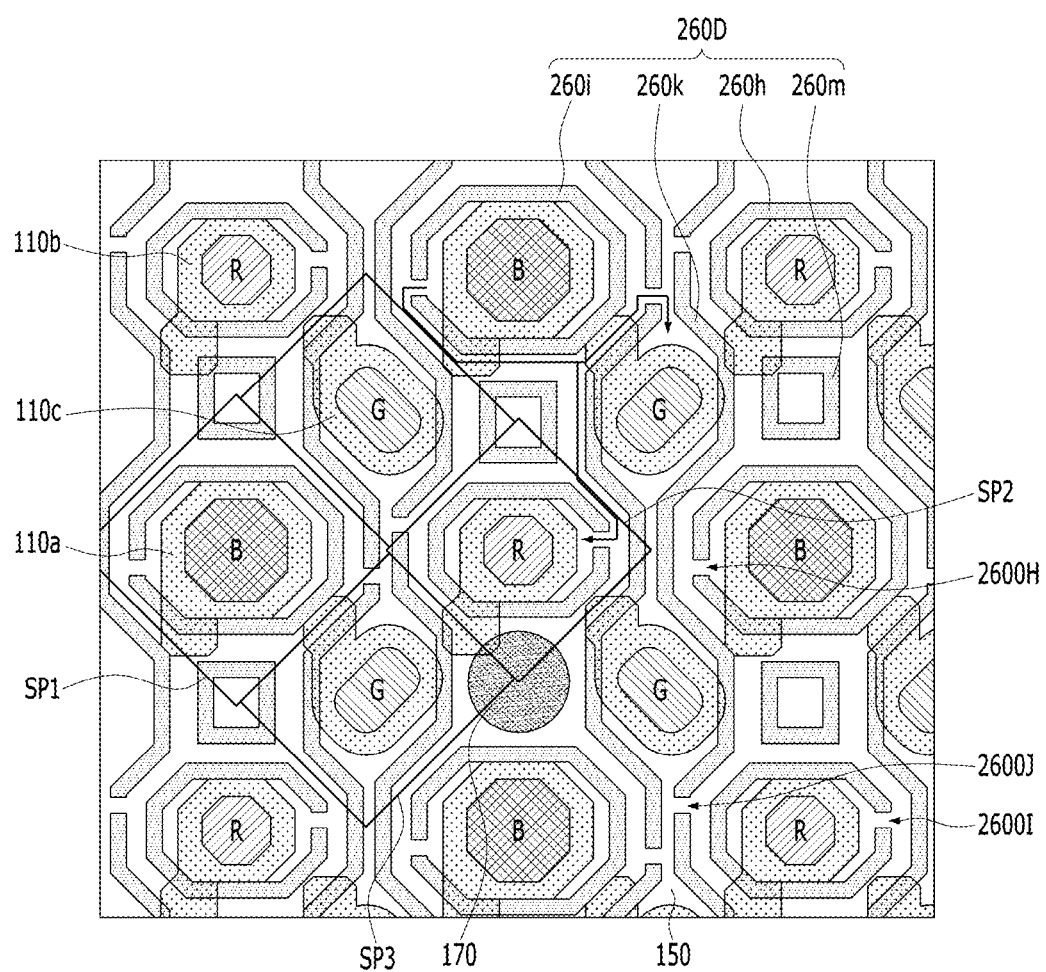

As shown in FIG. 9D, in the light emitting display device according to the ninth embodiment of the present disclosure, a first spacer structure 260D further includes closed loop-shaped fifth patterns 260*m*, which are spaced apart from first patterns 260*i* and second patterns 260*h*, between first and second subpixels SP1 and SP2 adjacent to each other in the vertical direction, compared to the eighth embodiment. In this case, because, at least between the first and second subpixels SP1 and SP2 adjacent to each other in the vertical direction, current flowing in the emission part B of the first subpixel SP1 flows out through an eighth open region 2600H and passes around the fifth pattern 260*m*, and flows into a ninth open region 2600I formed at one side of the emission part R of the second subpixel SP2, the path of leakage current is elongated, compared to the eighth embodiment, and thus, there is little influence of leakage current between the first and second subpixels SP1 and SP2.

Further, between the first subpixel SP1 and the third subpixel SP3, current flowing in the emission part B of the first subpixel SP1 flows out through the eighth open region 2600H, passes around the fifth pattern 260*m*, and flows along the shape of the bent part of a tenth open region 2600J of a third pattern 260*k*, located opposite the eighth open region 2600H, there is little influence of leakage current between the first and third subpixels SP1 and SP3 due to such current path.

Figure 9E:
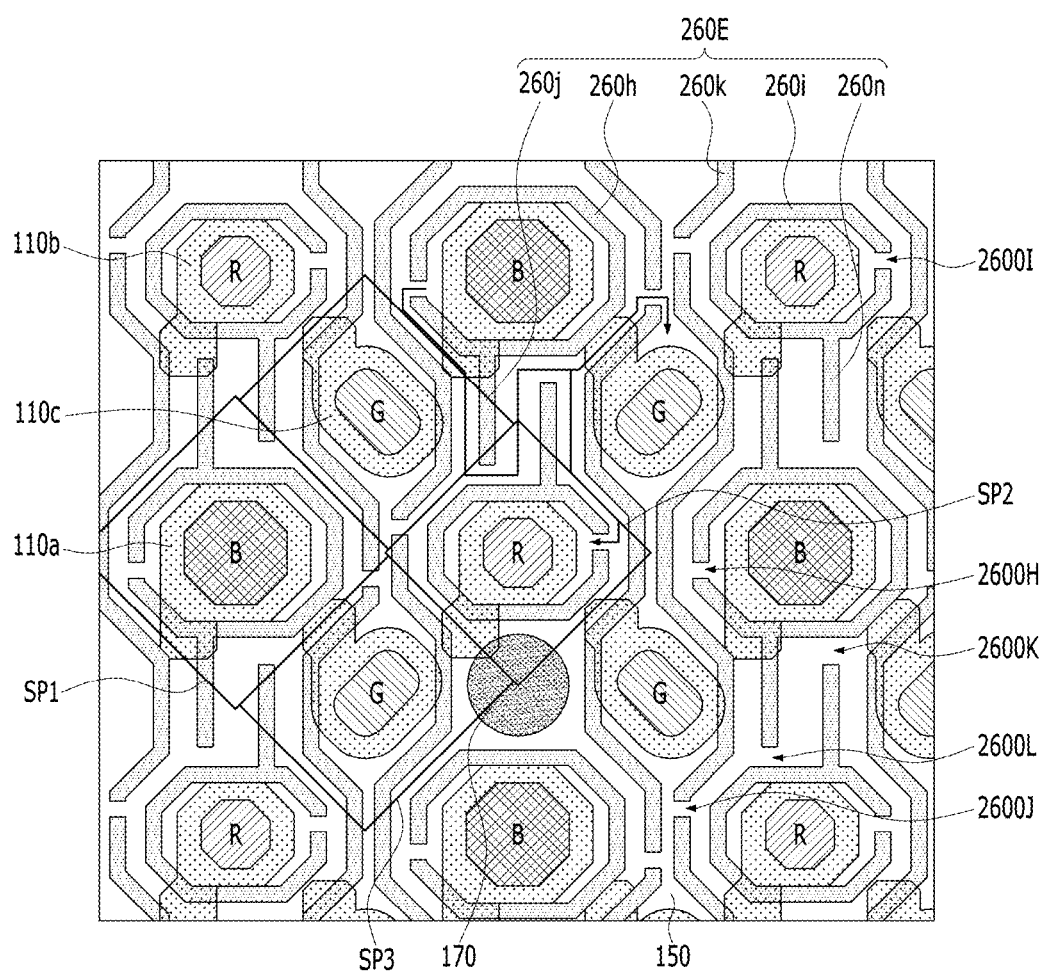

As shown in FIG. 9E, in the light emitting display device according to the tenth embodiment of the present disclosure, a first spacer structure 260E further includes first protrusion patterns 260*j* and second protrusion patterns 260*n*, which protrude from the first patterns 260*h* and the second patterns 260*i*, configured to surround the emission parts B and R of the first and second subpixels SP1 and SP2, to each other so as to be spaced apart from each other, compared to the eighth embodiment. In this case, the first protrusion pattern 260*j* is spaced apart from the adjacent second pattern 260*i* by an eleventh open region 2600L, and the second protrusion pattern 260*n* is spaced apart from the adjacent first pattern 260*h* by a twelfth open region 2600K.

In the light emitting display device according to the tenth embodiment, current flowing outwards from the first subpixel SP1 through the eighth open region 2600H passes between the first pattern 260*h* and the third pattern 260*k* adjacent to each other, passes between the first protrusion pattern 260*j* and the third pattern 260*k* adjacent to each other, passes through the eleventh open region 2600L, is bent to pass between the first and second protrusion patterns 260*j* and 260*n*, passes through the twelfth pattern 2600K, passes through the second protrusion pattern 260*n* and the third pattern 260*k* adjacent to each other, passes along the second pattern 260*h*, and then passes through the ninth open region 2600I of the second pattern 260*h*. In this case, the flow path of current is excessively long, and thus influence of leakage current between the first and second subpixels SP1 and SP2 may be prevented.

Current flowing between the first subpixel SP1 and the third subpixel SP3 also passes through a zigzag-shaped path through the eleventh and twelfth open regions 2600L and 2600K between the first and second protrusion patterns 260*j* and 260*n* and the second pattern 260*h* and the first pattern 260*i* adjacent thereto, and thus, current flowing out from the first subpixel SP1 may scarcely influence the third subpixel SP3 adjacent thereto.

Hereinafter, the shapes of first spacer structures in other embodiments having structures and arrangements of subpixels differing from the above-described structure and arrangement of the subpixels will be described.

FIGS. 10A to 10H are plan views illustrating light emitting display devices according to eleventh to eighteenth embodiments of the present disclosure.

In common in the light emitting display devices according to the eleventh to eighteenth embodiments, which will be described below, first subpixels SP1 are arranged in a first axis direction (in the vertical direction in these figures), second subpixels SP2 and third subpixels SP3 are alternately arranged in the first axis direction, and the first subpixel SP1 has a shape configured to neighbor at least one of the second subpixel SP2 and the third subpixel SP3 in a second axis direction (in the horizontal direction in these figures) intersecting the first axis direction.

Further, the first to third subpixels SP1, SP2 and SP3 respectively include emission parts B, R and G formed therein, and regions of the first to third subpixels SP1, SP2 and SP3, which are exposed from a bank 350, may be referred to as the emission parts B, R and G.

In the first to third subpixels SP1, SP2 and SP3, first electrodes 310*a*, 310*b* and 310*c*, which overlap the corresponding emission parts B, R and G and overlap the bank 350 at the edges thereof, are provided.

The first electrodes 310*a*, 310*b* and 310*c* of the first to third subpixels SP1, SP2 and SP3 may be connected to thin film transistors provided on the substrate 400 (with reference to FIGS. 2 to 4) through connection parts CT1, CT2 and CT3.

Figure 10A:
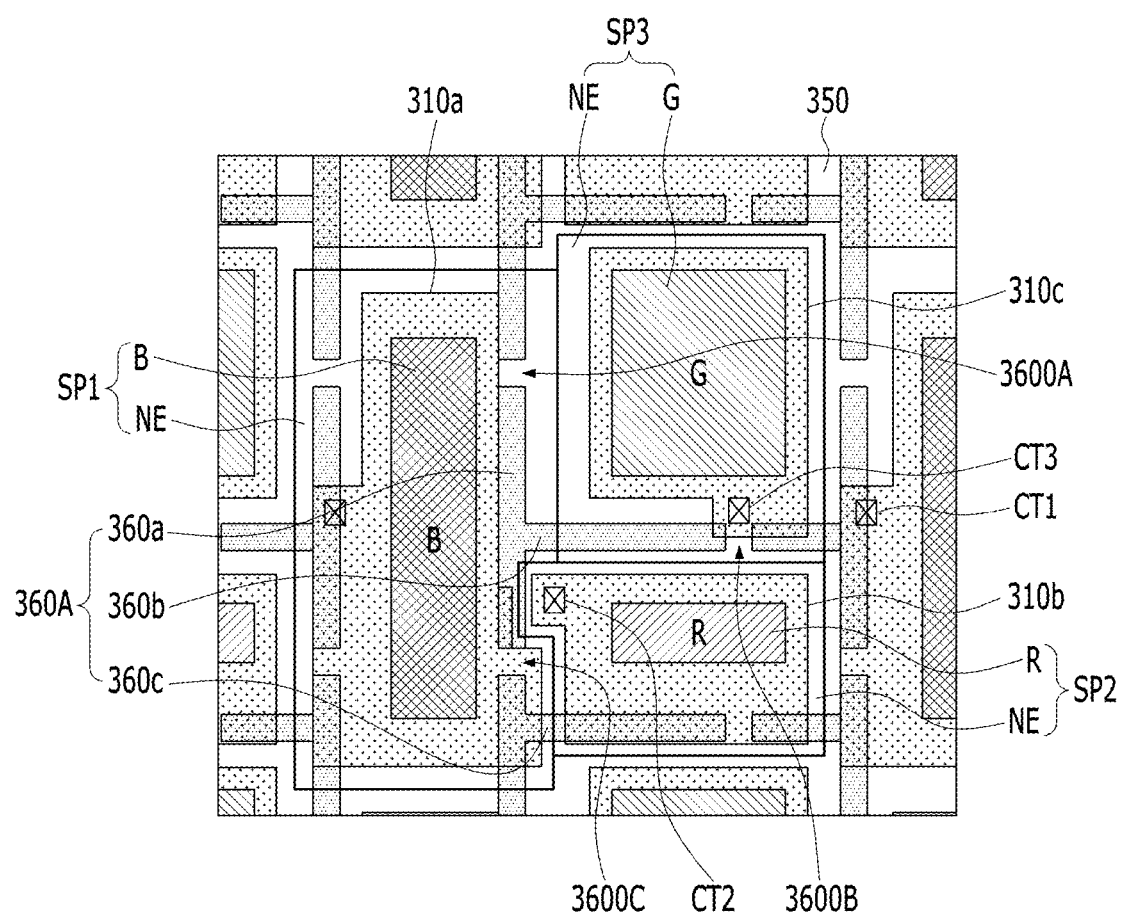
FIGS. 10A to 10H are plan views illustrating light emitting display devices according to eleventh to eighteenth embodiments of the present disclosure, respectively.

As shown in FIG. 10A, in the light emitting display device according to the eleventh embodiment of the present disclosure, a first spacer structure 360A may include first patterns 360*a* arranged in the first axis direction (i.e., the vertical direction) between the first subpixels SP1 and the second subpixels SP2, and second patterns 360*b* and 360*c* arranged between the second subpixels SP2 and the third subpixels SP3. The second patterns 360b and 360c may be arranged in the second axis direction (i.e., the horizontal direction) intersecting the first axis direction.

The first patterns 360a may have first open regions 3600A adjacent to the emission parts B of the first subpixels SP1, and the first open regions 3600A may be adjacent to the emission parts G of the third subpixels SP3.

Further, the second patterns 360b and 360c may have second open regions 3600B between the second and third subpixels SP2 and SP3 adjacent to each other. The second patterns 360b and 360c may be divided into primary patterns 360b which are adjacent to the centers of the emission parts B of the first subpixels SP1 and extend between the second and third subpixels SP2 and SP3, and secondary patterns 360c which are adjacent to the edges of the emission parts B of the first subpixels SP1 and extend between the second and the third subpixels SP2 and SP3.

Further, the first patterns 360a may have third open regions 3600C between the first subpixels SP1 and the second subpixels SP2. It may be more effective in terms of blocking of leakage current flowing from the first subpixel SP1 to the second subpixel SP2 to locate the third open regions 3600C in parts of the first patterns 360a which are not adjacent to the emission parts R of the second subpixel SP2.

Here, the first patterns 360a and the second patterns 360b and 360c may be connected to each other. The connection parts therebetween may be formed at the intersections between the first subpixels SP1 and the second and third subpixels SP2 and SP3. Therefore, the first spacer structure 360A may be arranged at the intersections, and thus, when the first subpixel SP1 is turned on, the shortest paths of current from the first subpixel SP1 to the second and third subpixels SP2 and SP3 are blocked and thereby the effect of preventing or at least reducing leakage current may be improved.

The first and third open regions 3600A and 3600C, which are provided in the first patterns 360a, and the second open regions 3600B, which are provided in the second patterns 360b and 360c, serve to prevent or reduce an increase in resistance of the second electrode 180 (with reference to FIGS. 2 to 4), formed on the organic stacks 121, 122a/122b and 123 (with reference to FIGS. 2 to 4), in the vertical direction.

The light emitting display device according to this embodiment diverts current flowing out from the center of the emission part B of the first subpixel SP1, and may thus mitigate the influence of turning-on of the first subpixel SP1 on driving of the second and third subpixels SP2 and SP3 adjacent to the first subpixel SP1.

Figure 10B:
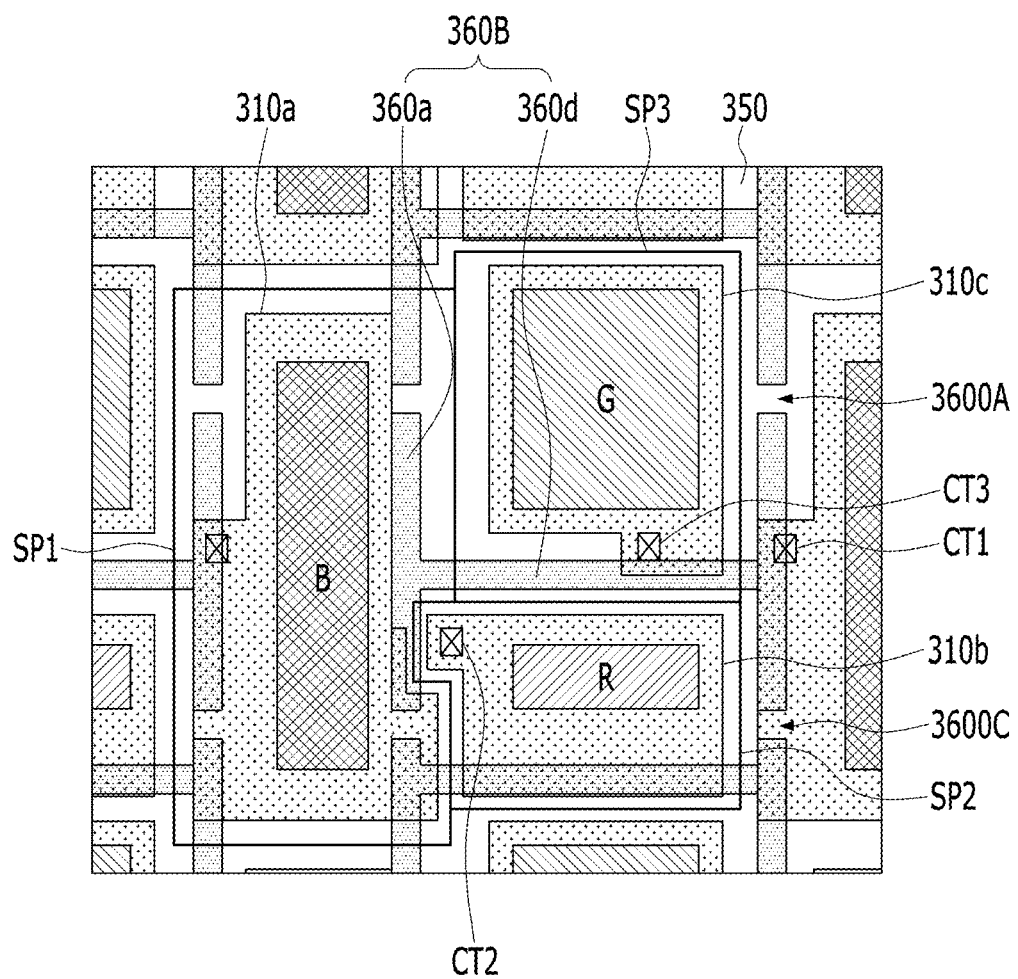

As shown in FIG. 10B, in the light emitting display device according to the twelfth embodiment of the present disclosure, a first spacer structure 360B is configured such that second patterns 360d have no open region so as to completely isolate the emission parts R and G of the second and third subpixels SP2 and SP3 from each other, compared to the eleventh embodiment.

In this case, the light emitting display device according to the twelfth embodiment is further advantageous in that leakage current from the emission part G of the third subpixel SP3 having relatively high threshold voltage to the emission part R of the second subpixel SP2 is blocked.

Figure 10C:
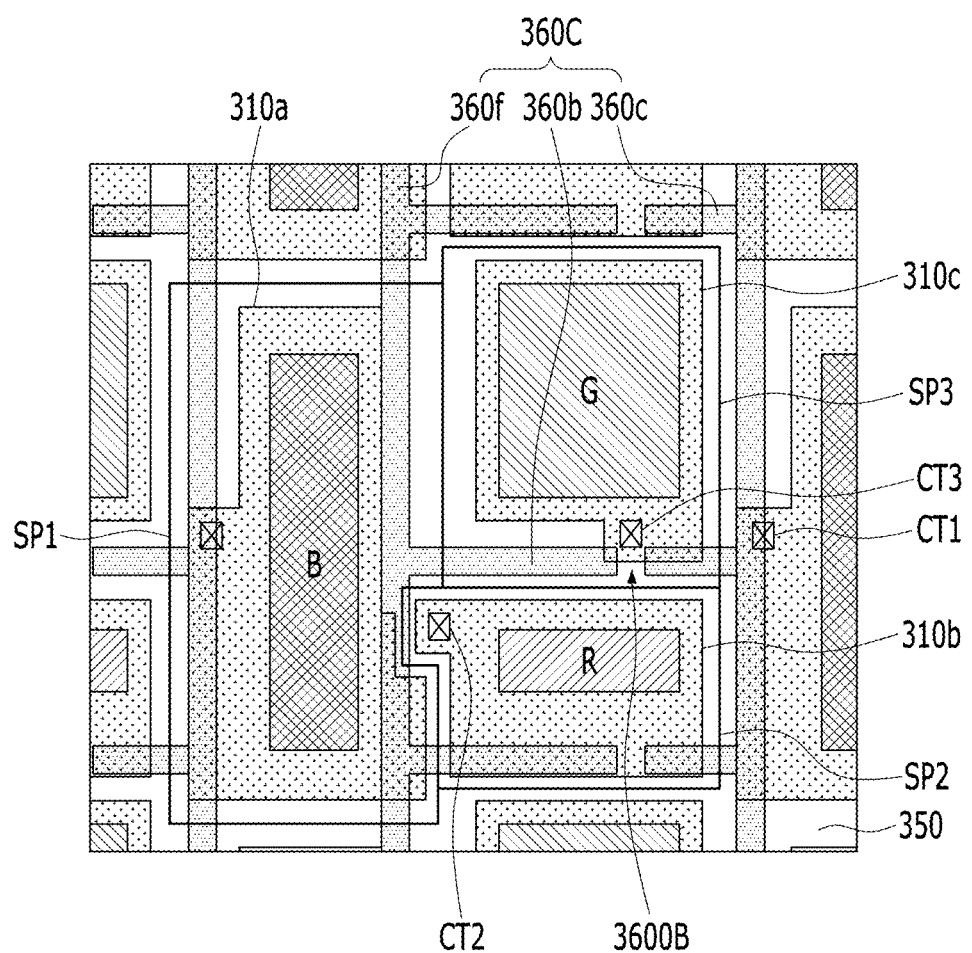

As shown in FIG. 10C, in the light emitting display device according to the thirteenth embodiment of the present disclosure, a first spacer structure 360C is configured such that first patterns 360f have no open region so as to completely isolate the first subpixels SP1 and the second and third subpixels SP2 and SP3 from each other, compared to the eleventh embodiment.

In this case, the light emitting display device according to the thirteenth embodiment is further advantageous in that leakage current from the emission part B of the first subpixel SP1 having the highest threshold voltage to the emission parts R and G of the second and third subpixels SP2 and SP3 is blocked.

Figure 10D:
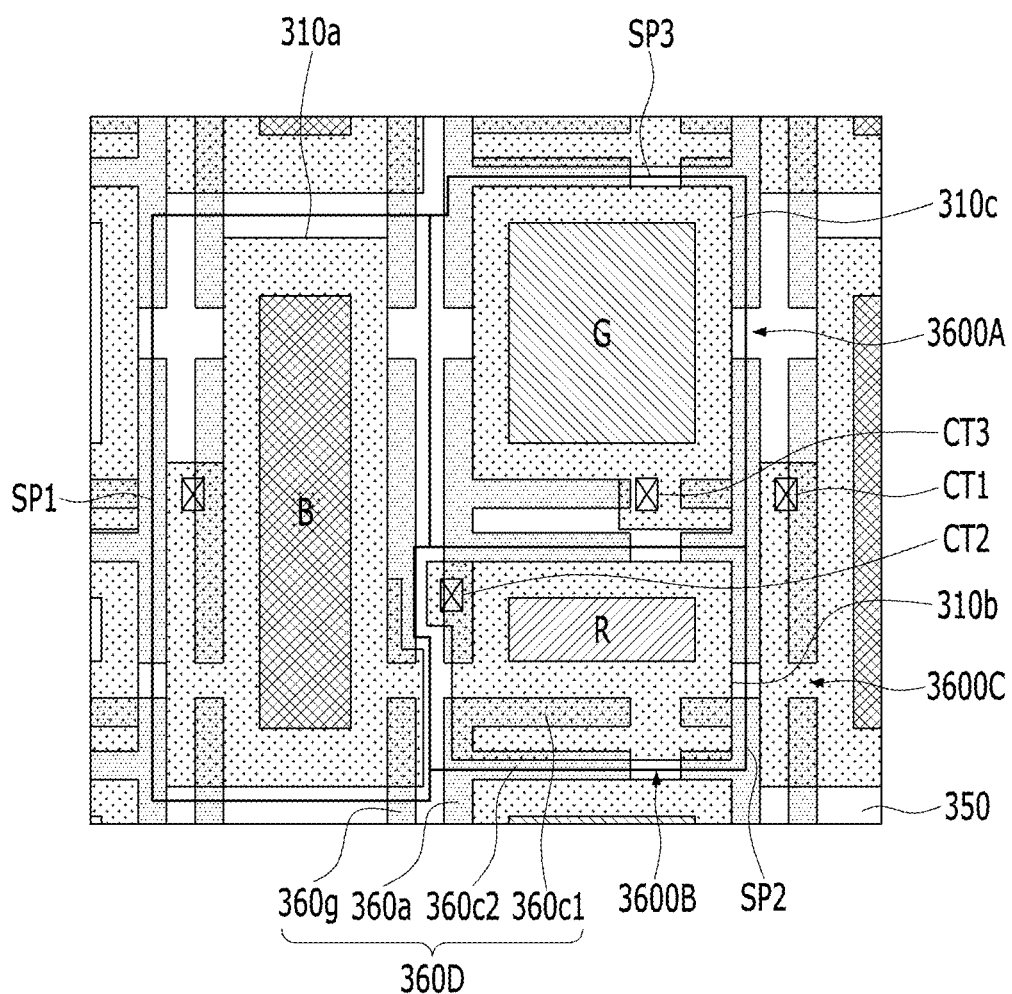

As shown in FIG. 10D, in the light emitting display device according to the fourteenth embodiment of the present disclosure, a first spacer structure 360D further includes first auxiliary patterns 360g parallel to first patterns 360a, and two second patterns 360c1 and 360c2 are connected to the first pattern 360a, compared to the eleventh embodiment. The light emitting display device according to the fourteenth embodiment may have similar effects of preventing or reducing leakage current and reducing resistance of the second electrode to the eleventh embodiment.

Figure 10E:
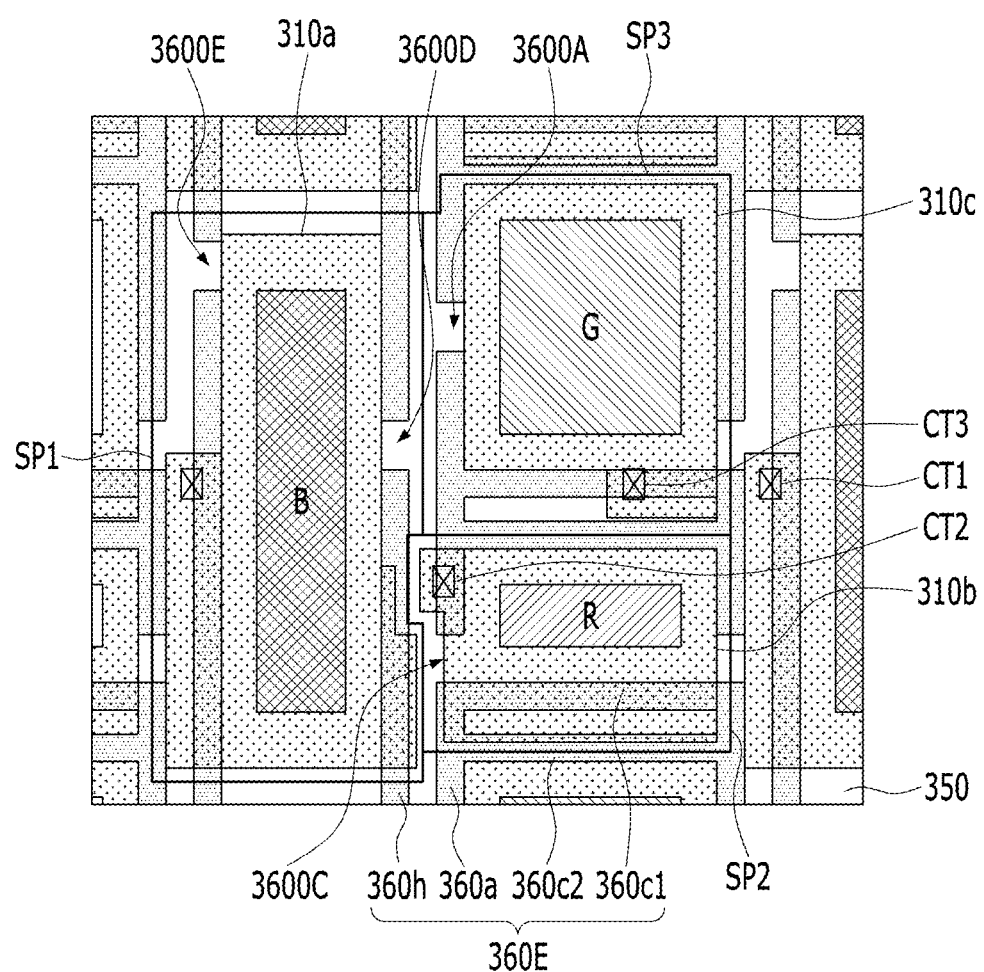

As shown in FIG. 10E, in the light emitting display device according to the fifth embodiment of the present disclosure, a first spacer structure 360E further includes first auxiliary patterns 360h parallel to first patterns 360a, and two second patterns 360c1 and 360c2 are connected to the first pattern 360a, compared to the twelfth embodiment. Compared to the fourteenth embodiment, no open regions are formed in the second patterns 360c1 and 360c2, and thus, the effect of blocking leakage current between the second and third subpixels SP2 and SP3 may be improved.

Further, fourth and fifth open regions 3600D and 3600E formed in the first auxiliary patterns 360h adjacent to the emission parts B of the first subpixels SP1 are located on horizontal lines different from the horizontal lines on which the first and third open regions 3600A and 3600C are formed, and thereby the direct path of current is blocked and thus the effect of preventing or reducing leakage current may be improved.

Figure 10F:
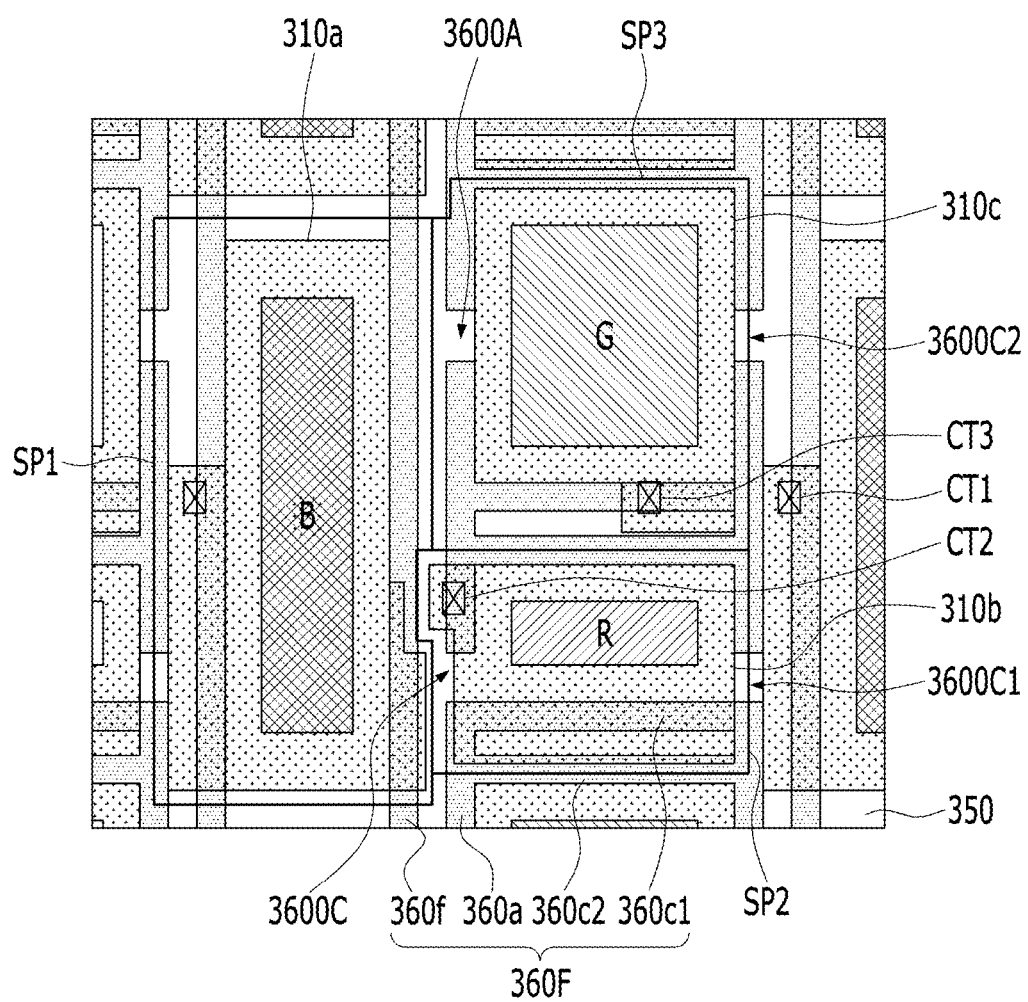

As shown in FIG. 10F, in the light emitting display device according to the sixteenth embodiment of the present disclosure, a first spacer structure 360E further includes first auxiliary patterns 360f having no open regions parallel to first patterns 360a, and two second patterns 360c1 and 360c2 are connected to the first pattern 360a, compared to the fifth embodiment. Compared to the fifteenth embodiment, no open regions are formed in the first auxiliary patterns 360f, and thus, leakage current making a detour from the emission part B of the first subpixel SP to the emission part R of the second subpixel SP2 and the emission part G of the third subpixel SP3 may be completely blocked.

Figure 10G:
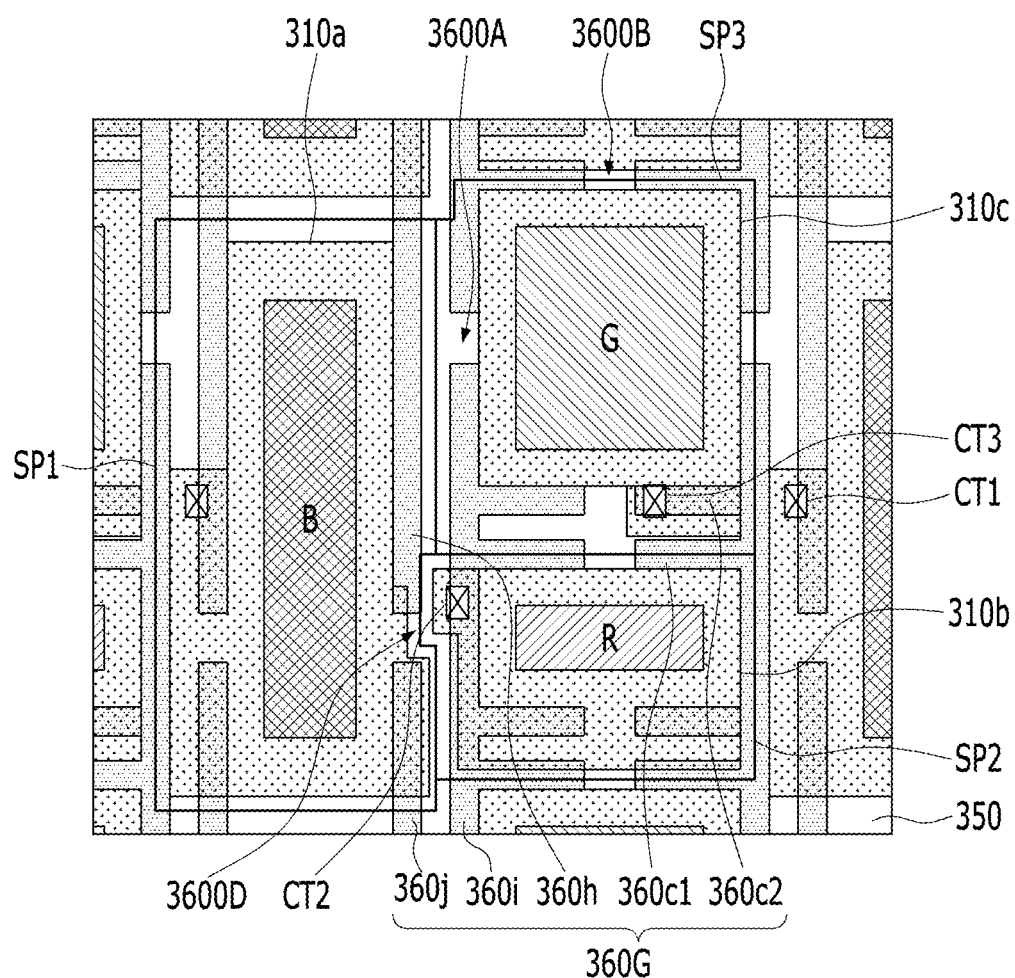

As shown in FIG. 10G, in the light emitting display device according to the seventeenth embodiment of the present disclosure, a first spacer structure 360G may include first patterns 360i and first auxiliary patterns 360j arranged in parallel in the first axis direction (the vertical direction) between the first subpixels SP1 and the second subpixels SP2, and second patterns 360c1 and 360c2 arranged in parallel in the second axis direction intersecting the first axis direction between the second subpixels SP2 and the third subpixels SP3. The second patterns 360c1 and 360c2 may have second open regions 3600B adjacent to each other.

The first patterns 360i and the first auxiliary patterns 360j may respectively have first open regions 3600A and fourth open regions 3600D which are not adjacent to each other. In the light emitting display device according to the seventeenth embodiment, current flowing out from the emission part B of the first subpixel SP1 makes a detour to the emission part G of the third subpixel SP3 through the first and fourth open regions 3600D and 3600A which are not adjacent to each other, and thereby, an influence of leakage current from the first subpixel SP1 on the third subpixel SP3 may be minimized.

Further, a direct path of current from the first subpixel SP1 to the second subpixel SP2 in the horizontal and vertical directions is blocked, and thereby, an influence of leakage current from the first subpixel SP1 on the second subpixel SP2 may be completely blocked.

Figure 10H:
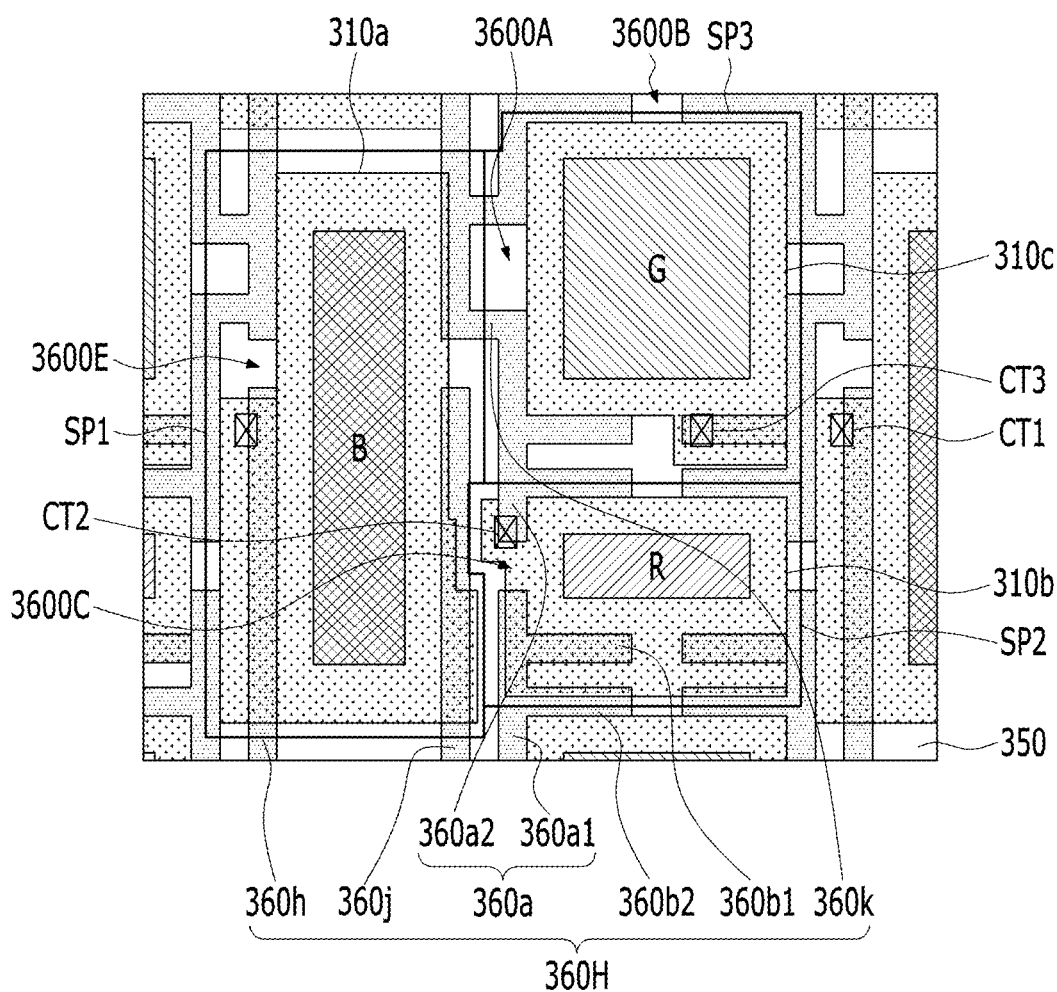

As shown in FIG. 10H, in the light emitting display device according to the eighteenth embodiment of the present disclosure, a first spacer structure 360G may include first patterns 360a: 360a1 and 360a2 and first auxiliary patterns 360j arranged in parallel in the first axis direction (the vertical direction) between the first subpixels SP1 and the second subpixels SP2, and second patterns 360b1 and 360b2 arranged in parallel in the second axis direction intersecting the first axis direction between the second subpixels SP2 and the third subpixels SP3. The second patterns 360c1 and 360c2 may have second open regions 3600B adjacent to each other.

The first patterns 360a are divided into first subpatterns 360a1 and second subpatterns 360a2, and may thus have a first open region 3600A adjacent to the emission part G of the third subpixel SP3 between the first subpattern 360a and the second subpatterns 360a2, and a third open region 3600C adjacent to the emission part R of the second subpixel SP2 between the second subpatterns 360a2 and the first subpattern 360a1. Further, the first patterns 360a may further include connection parts 360k configured to connect the first patterns 360a1 and 360a2 and the first auxiliary patterns 360j, which are parallel to each other. The first auxiliary patterns 360j may have fifth open regions 3600E arranged on a horizontal line different from the first and third open regions 3600A and 3600C. The connection parts 360k are located between the first patterns 360a1 and 360a2 and the first auxiliary patterns 360j, which are parallel to each other, thus being capable of blocking leakage current or guiding the flow of current.

In the light emitting display device according to the eighteenth embodiment shown in this figure, the path of current flowing out from the emission part B of the first subpixel SP1 makes a detour to the second subpixel SP2 through the fifth and third open regions 3600D and 3600C which are not adjacent to each other, and thereby, an influence of leakage current from the first subpixel SP1 on the second subpixel SP2 may be minimized.

Further, a direct path of current from the first subpixel SP1 to the third subpixel SP3 in the horizontal and vertical directions is blocked, and thereby, an influence of leakage current from the first subpixel SP1 on the third subpixel SP3 may be completely blocked.

In the light emitting display devices according to the eleventh to eighteenth embodiments, a second spacer structure 170 (with reference to FIG. 1) having a greater area and a greater height than the first spacer structure 360A to 360G may be formed. The second spacer structure 170 is spaced apart from each of the first spacer structures 360A to 360G and thus primarily contacts with a deposition mask so as to support the deposition mask, thus protecting elements (for example, the bank and the first spacer structure) provided under the second spacer structure.

Figure 11:
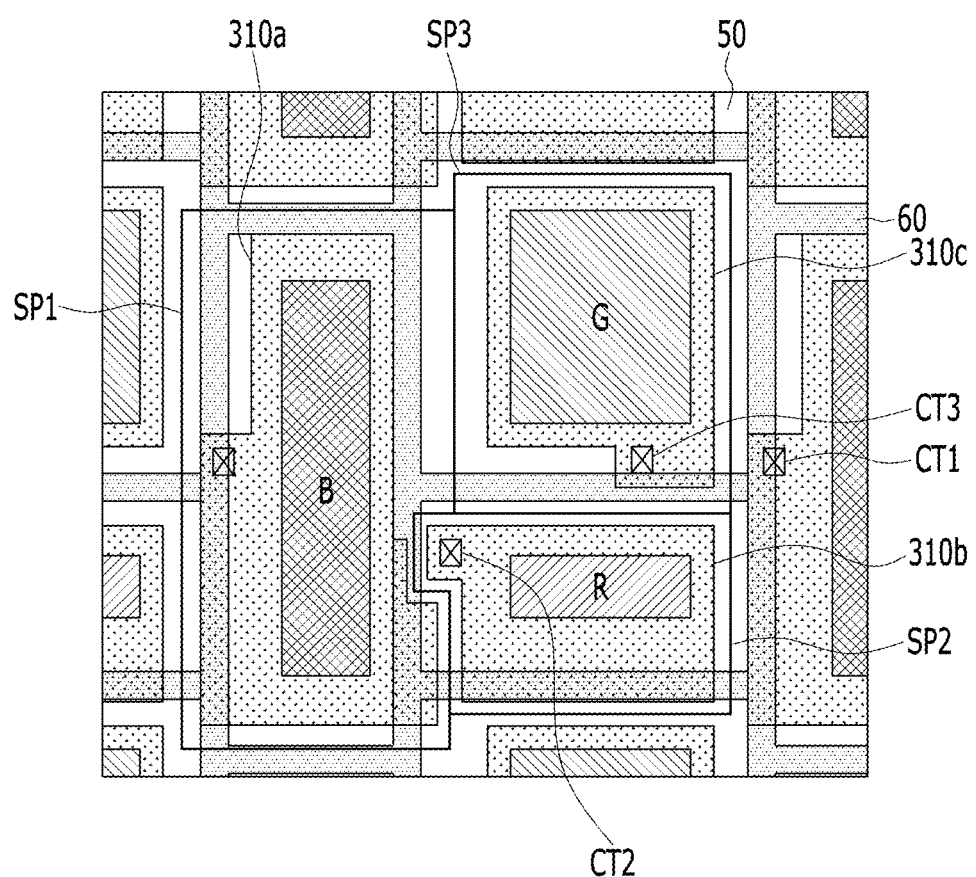
FIG. 11 is a plan view illustrating a light emitting display device according to a nineteenth embodiment of the present disclosure.

FIG. 11 is a plan view illustrating a light emitting display device according to a nineteenth embodiment of the present disclosure.

As shown in FIG. 11, in the light emitting display device according to the nineteenth embodiment of the present disclosure, a first spacer structure 60 is formed so as to completely surround emission parts B, R and G of respective subpixels SP1, SP2 and SP3. In this case, an influence of the turn-on operation of each subpixel on other subpixels may be prevented, but resistance of a second electrode (cathode), which must be formed on the entirety of the surfaces of the subpixels, in the horizontal and vertical direction may be increased due to horizontal and vertical connection of the first spacer structure 60. Therefore, the light emitting display devices according to the eleventh to eighteenth embodiments of the present disclosure, in which open regions are provided on at least one of the emission parts, may be desirable from the point of view of maintenance of uniform voltage in the second electrode.

Hereinafter, Test Example 1 which is implemented so as to comparatively describe the effects exhibited by the first spacer structure of the light emitting display device according to the present invention will be described.

Figure 12A:
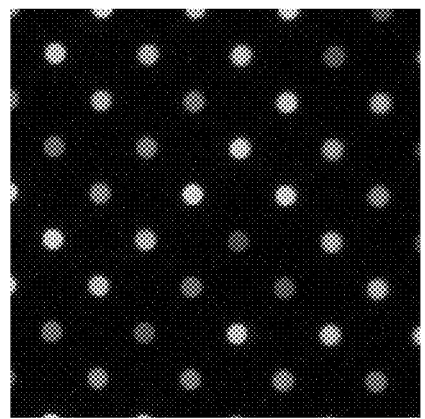
FIGS. 12A and 12B are optical images of the light emitting display device according to the first embodiment of the present disclosure and a light emitting display device according to Example 1, when blue light is emitted at a low grayscale level.
Figure 12B:
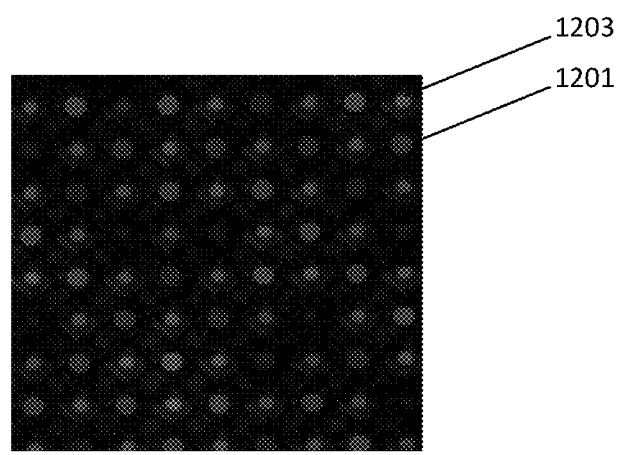

FIGS. 12A and 12B are optical images of a light emitting display device according to Test Example 1 such as the first embodiment of the present disclosure and the light emitting display device according to the Test Example 2, respectively, when blue light is emitted at a low grayscale level.

Hereinafter, the emission states of the light emitting display device having the first spacer structure 160 according to the Test Example 1 such as the first embodiment of the present disclosure and the light emitting display device having no first spacer structure according to Test Example 2, when only blue subpixels thereof were turned on, were observed through a microscope.

As shown in FIG. 12A, it may be confirmed that, in the light emitting display device according to the Test Example 1 such as the first embodiment, in which the first spacer structure 160 having an inverse tapered shape is provided, only the blue subpixels emit light. Further, it may be confirmed that, because the first spacer structure has the open regions, voltage is uniformly applied to the second electrode (cathode) and thus the blue subpixels effectively emitted light.

In contrast, as shown in FIG. 12B, it may be confirmed that, in the light emitting display device of Test Example 2, in which no first spacer structure having an inverse tapered shape is provided, when the blue subpixels 1201 were turned on, the red subpixels 1203 having low threshold voltage around the blue subpixels were turned on. That is, undesired subpixels were turned on due to lateral leakage current, thus causing deterioration in image quality.

Figure 13:
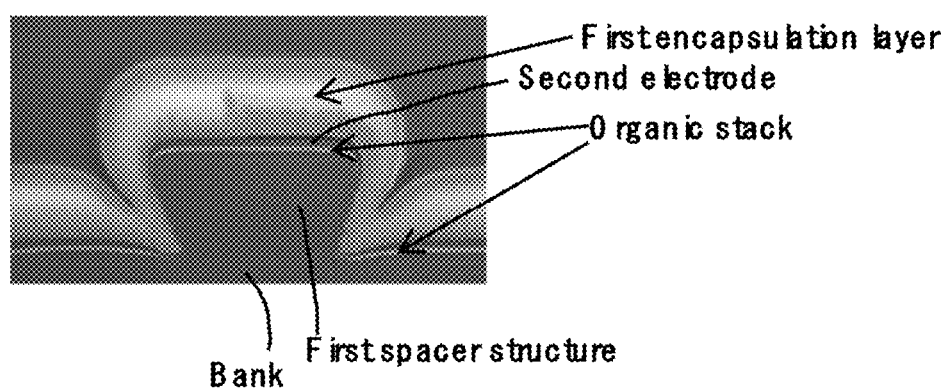
FIG. 13 is a scanning electron microscope (SEM) image representing a first spacer structure having an inverse tapered shape and elements therearound after formation of a first encapsulation layer, in the light emitting display device according to the preset disclosure.

FIG. 13 is an SEM image representing the first spacer structure having an inverse tapered shape and the elements therearound after formation of the first encapsulation layer, in the light emitting display device according to the preset invention.

FIG. 13 shows the first spacer structure and the elements therearound of the light emitting display device according to the present disclosure, after formation of the first encapsulation layer, and it may be confirmed that the organic stack is not formed on the side part of the first spacer structure, but is formed on the flat upper part of the first spacer structure and on the upper surface of the bank, and thus, the organic stack is separated into respective regions by the upper part of the first spacer structure and the upper surface of the bank having a step therebetween. The first encapsulation layer, which is formed of an inorganic material on the organic stack, has a thickness equal to or greater than about 1 μm, and it may be confirmed that the first encapsulation layer formed of an inorganic material is formed to have continuity, and is thus continuously formed not only on the upper part of the first spacer structure and the surface of the bank not only on the side part of the first spacer structure.

This means that the organic stack is separated into the regions corresponding to respective subpixels due to provision of the first spacer structure and, after formation of the second electrode, the first encapsulation layer is formed to cover the first spacer structure without disconnection, and thus, the light emitting display device is normally encapsulated.

After formation of the first encapsulation layer, the second encapsulation layer formed of an organic material may be further provided on the light emitting display device so as to planarize all regions of the light emitting display device.

In the light emitting display device according to each of the above-described embodiments of the disclosure invention, the first spacer structure having an inverse tapered shape is located on the bank between adjacent subpixels, and the common layers deposited after formation of the first spacer structure are disconnected at the first spacer structure having the inverse tapered shape, thereby being capable of blocking lateral leakage current caused by the common layers having high conductivity.

Further, the first spacer structure having the inverse tapered shape provided on the bank is limited in terms of the length and width thereof, thereby being capable of preventing or at least reducing an increase in the sheet resistance of a specific region of the second electrode (cathode) formed after formation of the common layer structure. Therefore, the second electrode may maintain uniform voltage. That is, the first spacer structure has open regions with respect to at least some of the emission parts, thus being capable of preventing or at least reducing an increase in the resistance of the second electrode.

Moreover, as the pixel structures of display devices are diversified, the first spacer structure is not limited to a uniaxial shape but has a shape surrounding the emission parts and including open regions formed in some parts of closed loop-type patterns configured to surround the emission parts so as to additionally guide the flow of current, thereby increasing the distance between the open regions of the first spacer structure between adjacent emission parts and thus being capable improving the effect of preventing or at least reducing lateral leakage current.

Further, in addition to the first spacer structure, a second spacer structure having a positive tapered shape is provided on the bank so as to have a greater height than the first spacer structure, thereby being capable of supporting a deposition mask when the deposition mask is placed on the substrate so as to form light emitting devices, and thus protecting the elements provided under the second spacer structure.

Furthermore, the first spacer structure having the inverse tapered shape is disposed at least between adjacent subpixels configured to emit light with different colors and to have a threshold voltage difference therebetween, so that the common layers are disconnected at the outside of the first spacer structure, thereby preventing, when the subpixel having high threshold voltage is selectively turned on, the subpixel having low threshold voltage arranged adjacent to the turned-on subpixel from being turned on due to lateral leakage current.

For this purpose, a light emitting display device according to one embodiment the present disclosure may include a substrate including a plurality of first to third subpixels arranged to neighbor one another, each of the first to third subpixels including an emission part and a non-emission part configured to surround the emission part, a bank provided in the non-emission parts, first electrodes covered with the bank and respectively provided in the first to third subpixels so as to expose the respective emission parts, a first spacer structure having an inverse tapered shape configured to surround at least one side of each of the emission parts of the first to third subpixels on the bank, a common layer structure located on the first electrodes and the first spacer structure and disconnected at an edge of the first spacer structure, and a second electrode located on the common layer structure.

The first spacer structure corresponding to at least one of the first to third subpixels may have open regions formed in a virtual closed loop configured to surround the emission part of the at least of the first to third subpixels.

The light emitting display device may further include a second spacer structure having a positive tapered shape spaced apart from the first spacer structure and configured to have a greater height than the first spacer structure.

The first spacer structure may include first patterns configured to surround the emission parts of the first subpixels, second patterns configured to surround the emission parts of the second subpixels, and third patterns configured to surround the emission parts of the third subpixels, and the first to third patterns may be spaced apart from one another.

The first patterns and the second patterns respectively may have open regions provided so as not to neighbor each other.

The first spacer structure may have open regions formed in the first patterns and open regions formed in the second patterns between the emission parts of the first subpixels and the emission parts of the second subpixels, and extensions connected to the third patterns to block the open regions formed in the first and second patterns may be provided between the open regions formed in the first and second patterns.

The first spacer structure may further include fourth patterns provided between the first patterns and the second patterns so as to be spaced apart from the first and second patterns.

The first spacer structure may further include, between the first patterns and the second patterns, first protrusions configured to protrude from the first patterns so as to be spaced apart from the second patterns by a first distance, and second protrusions configured to protrude from the second patterns so as to be spaced apart from the first patterns by a second distance.

The first spacer structure may further include connection parts configured to connect the third patterns between adjacent third subpixels.

At least one of the first to third patterns may have a plurality of open regions, and may be divided by the open regions serving as boundaries.

The first subpixels and the second subpixels may be alternately arranged in rows and columns, and the third subpixels may be arranged to alternate with each of the first subpixels and the second subpixels in a diagonal direction.

The first subpixels may be arranged in a first axis direction, the second subpixels and the third subpixels may be alternately arranged in the first axis direction, and the first subpixel may neighbor at least one of the second subpixel and the third subpixel in a second axis direction.

The first spacer structure may include first patterns arranged in the first axis direction between the first subpixels and the second subpixels, and second patterns arranged between the second subpixels and the third subpixels.

At least one of the first patterns and the second patterns may have an open region adjacent to one of the emission parts of the first to third subpixels.

At least one of the first patterns and the second patterns may include a plurality of subpatterns arranged parallel to each other.

The subpatterns arranged parallel to each other may have open regions provided so as not to neighbor each other.

The light emitting display device may further include guide parts configured to connect the subpatterns arranged parallel to each other.

The first patterns and the second patterns may be connected to each other, and contact points between the first patterns and the second patterns may neighbor the emission parts of the first subpixels.

The first subpixels may have a first emission layer configured to contact the common layer structure between the first and second electrodes so as to emit light with a first color, the second subpixels may have a second emission layer configured to contact the common layer structure between the first and second electrodes so as to emit light with a second color having a longer wavelength than a wavelength of the first color, and the third subpixels may have a third emission layer configured to contact the common layer structure between the first and second electrodes so as to emit light with a third color having a wavelength between the wavelength of the first color and a wavelength of the second color.

The first spacer structure may have a width less than a critical dimension of an emission part having the smallest size among the emission parts of the first to third subpixels.

The common layer structure may include at least one of a hole injection layer, a hole transport layer, an electron blocking layer, an emission layer, a hole blocking layer, an electron transport layer, an electron injection layer and a charge generation layer.

Among the first to third subpixels, a threshold voltage of the first subpixel may be highest, and a threshold voltage of the second subpixel may be lowest.

Among the first to third subpixels, an area of the first subpixel may be largest, and an area of the second subpixel may be smallest.

A light emitting display device according to another embodiment the present invention may include a substrate including a plurality of emission parts and non-emission parts between the emission parts, first electrodes respectively provided in the emission parts, a bank configured to selectively overlap the first electrodes, and provided in the non-emission parts, a first spacer structure having an inverse tapered shape configured to have open regions formed in a virtual closed loop configured to surround at least one of the emission parts and to surround at least one side of each of the emission parts, between adjacent emission parts on the bank, a common layer structure located on the first electrodes and the first spacer structure and disconnected at an edge of the first spacer structure, and a second electrode located on the common layer structure.

As is apparent from the above description, a light emitting display device according to the present invention has the following effects.

First, in the light emitting display device according to the present disclosure, a first spacer structure having an inverse tapered shape is located on a bank between adjacent subpixels, and common layers deposited after formation of the first spacer structure are disconnected at the first spacer structure having the inverse tapered shape, thereby being capable of blocking lateral leakage current caused by the common layers having high conductivity.

Second, the first spacer structure having the inverse tapered shape provided on the bank is limited in terms of the length and width thereof, thereby being capable of preventing or at least reducing an increase in the sheet resistance of a specific region of a second electrode (cathode) formed after formation of the common layer structure. Therefore, the second electrode may maintain uniform voltage. That is, the first spacer structure has open regions with respect to at least some of emission parts, thus being capable of preventing an increase in the resistance of the second electrode.

Third, as the pixel structures of display devices are diversified, the first spacer structure is not limited to a uniaxial shape but has a shape surrounding the emission parts and including open regions formed in some parts of closed loop-type patterns configured to surround the emission parts so as to additionally guide the flow of current, thereby increasing the distance between the open regions of the first spacer structure between adjacent emission parts and thus being capable improving the effect of preventing lateral leakage current.

Fourth, in addition to the first spacer structure, a second spacer structure having a positive tapered shape is provided on the bank so as to have a greater height than the first spacer structure, thereby being capable of supporting a deposition mask when the deposition mask is placed on the substrate so as to form light emitting devices, and thus protecting elements provided under the second spacer structure.

Fifth, the first spacer structure having the inverse tapered structure is disposed at least between adjacent subpixels configured to emit light with different colors and to have a threshold voltage difference therebetween, so that the common layers are disconnected at the outside of the first spacer structure, thereby preventing, when the subpixel having high threshold voltage is selectively turned on, the subpixel having low threshold voltage arranged adjacent to the turned-on subpixel from being turned on due to lateral leakage current.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A light emitting display device comprising:
a substrate comprising a first subpixel, a second subpixel, and a third subpixel arranged to neighbor one another, each of the first subpixel, the second subpixel, and the third subpixel comprising an emission part and a non-emission part to surround the emission part;
a bank at non-emission parts of the first subpixel, the second subpixel, and the third subpixel;
first electrodes covered with the bank and respectively at the first subpixel, the second subpixel, and the third subpixel to expose respective emission parts;
a first spacer structure on the bank;
a common layer structure located on the first electrodes and the first spacer structure and disconnected at an edge of the first spacer structure; and
a second electrode on the common layer structure,
wherein the first spacer structure reduces in width in a direction toward the substrate,
wherein the first spacer structure includes a first pattern that at least partially surrounds all sides of the emission part of the first subpixel, a second pattern that at least partially surrounds all sides of the emission part of the second subpixel, and a third pattern that at least partially surrounds sides of the emission part of the third subpixel, wherein the first pattern and the second pattern are independently provided between the first subpixel and the second subpixel, wherein at the non-emission part between the first subpixel and the second subpixel, the first spacer structure includes a first open region along a first direction in the first pattern and a second open region along the first direction in the second pattern; and wherein an extension is connected to the third pattern along the first direction, the extension between the first open region and the second open region.

2. The light emitting display device according to claim 1, wherein at least one of the first open region and the second open region is shorter than a length of one side of the emission part.

3. The light emitting display device according to claim 1, further comprising a second spacer structure spaced apart from the first spacer structure on the bank, wherein the second spacer structure has a higher height than the first spacer structure and widens in width in a direction toward the substrate.

4. The light emitting display device according to claim 1, wherein:

the first pattern, the second pattern, and the third pattern are spaced apart from one another, and wherein the first pattern and the second pattern are provided between the first subpixel and the second subpixel in parallel.

5. The light emitting display device according to claim 4, wherein the first pattern and the second pattern respectively have open regions so as not to neighbor each other.

6. The light emitting display device according to claim 1, wherein the first spacer structure further comprises a fourth pattern between the first pattern and the second pattern, the fourth pattern to be spaced apart from each of the first pattern and the second pattern.

7. The light emitting display device according to claim 1, wherein the first spacer structure further comprises, between the first pattern and the second pattern:

a first protrusion that protrudes from the first pattern toward the second pattern, the first protrusion being spaced apart from the second pattern by a first distance such that the first protrusion does not contact the second pattern; and a second protrusion that protrudes from the second pattern toward the first pattern, the second protrusion being spaced apart from the first pattern by a second distance such that the second protrusion does not contact the first pattern.

8. The light emitting display device according to claim 1, wherein the first spacer structure further comprises a connection part that is between the third subpixel and another third subpixel and connects the third pattern of the third subpixel and a third pattern of the other third subpixel.

9. The light emitting display device according to claim 1, wherein the third pattern is provided in a loop pattern and has a plurality of open regions in the loop pattern, and wherein each of the plurality of open regions is shorter than a length of one side of the emission part surrounded by the loop pattern.

10. The light emitting display device according to claim 1, wherein:

the first subpixel and the second subpixel are alternately arranged in rows and columns; and the third subpixel is arranged to alternate with each of the first subpixel and the second subpixel in a diagonal direction.

11. The light emitting display device according to claim 1, wherein:

a plurality of first subpixels are arranged in a first axis direction;

a plurality of second subpixels and a plurality of third subpixels are alternately arranged in the first axis direction; and a first subpixel from the plurality of first subpixels neighbors at least one of a second subpixel from the plurality of second subpixels and a third subpixel from the plurality of third subpixels in a second axis direction intersecting the first axis direction.

12. The light emitting display device according to claim 11, wherein the first spacer structure comprises:

first patterns arranged in the first axis direction between the plurality of first subpixels and the plurality of second subpixels; and second patterns arranged between the plurality of second subpixels and the plurality of third subpixels.

13. The light emitting display device according to claim 12, wherein at least one of the first patterns and the second patterns has an open region adjacent to one of emission parts of the plurality of first subpixels to the plurality of third subpixels.

14. The light emitting display device according to claim 12, wherein at least one of the first patterns and the second patterns comprises a plurality of sub-patterns arranged parallel to each other.

15. The light emitting display device according to claim 14, wherein the plurality of sub-patterns arranged parallel to each other have open regions provided so as not to neighbor each other.

16. The light emitting display device according to claim 14, further comprising guide parts configured to connect the plurality of sub-patterns arranged parallel to each other.

17. The light emitting display device according to claim 12, wherein the first patterns and the second patterns are connected to each other, and at least one contact point between the first patterns and the second patterns neighbors at least one emission part of the plurality of first subpixels.

18. The light emitting display device according to claim 1, wherein:

the first subpixel has a first emission layer to contact the common layer structure between the first and second electrodes so as to emit light with a first color;

the second subpixel has a second emission layer to contact the common layer structure between the first electrodes and the second electrodes so as to emit light with a second color having a longer wavelength than a wavelength of the first color; and the third subpixel has a third emission layer to contact the common layer structure between the first electrodes and the second electrodes so as to emit light with a third color having a wavelength between the wavelength of the first color and a wavelength of the second color.

19. The light emitting display device according to claim 1, wherein the first spacer structure has a width less than a width of a smallest emission part among the emission part of the first subpixel, the emission part of the second subpixel, and the emission part of the third subpixel.

20. The light emitting display device according to claim 1, wherein the common layer structure comprises at least one of a hole injection layer, a hole transport layer, an electron blocking layer, an emission layer, a hole blocking layer, an electron transport layer, an electron injection layer and a charge generation layer.

21. The light emitting display device according to claim 1, wherein, among the first subpixel, the second subpixel, and the third subpixel, a threshold voltage of the first subpixel is highest, and a threshold voltage of the second subpixel is lowest.

22. The light emitting display device according to claim 1, wherein, among the first subpixel, the second subpixel, and the third subpixel, an area of the first subpixel is largest, and an area of the second subpixel is smallest.

* * * * *